(12) United States Patent
Anayama

(10) Patent No.: US 6,539,040 B2
(45) Date of Patent: Mar. 25, 2003

(54) LASER DIODE AND FABRICATION PROCESS THEREOF

(75) Inventor: Chikashi Anayama, Nakakoma (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 0 days.

(21) Appl. No.: 09/942,670

(22) Filed: Aug. 31, 2001

(65) Prior Publication Data
US 2002/0027935 A1 Mar. 7, 2002

(30) Foreign Application Priority Data
Sep. 4, 2000 (JP) ........................ 2000-267634

(51) Int. Cl.[7] ................................. H01S 5/22
(52) U.S. Cl. ........................... 372/46; 372/45
(58) Field of Search ..................... 372/46, 45

(56) References Cited

U.S. PATENT DOCUMENTS 5,684,818 A * 11/1997 Anayama et al. .......... 372/46

FOREIGN PATENT DOCUMENTS

JP           6-45708      2/1994

* cited by examiner

Primary Examiner—James Davie
(74) Attorney, Agent, or Firm—Armstrong, Westerman & Hattori, LLP

(57) ABSTRACT

An $S^3$-type laser diode includes a p-type cladding layer formed on an active layer such that an inclined surface region thereof has a carrier concentration level of $1 \times 10^{18}$ cm$^{-3}$ or more, wherein the p-type cladding layer has a thickness of 0.35 μm or more.

20 Claims, 20 Drawing Sheets

LASER DIODE AND FABRICATION PROCESS THEREOF

CROSS-REFERENCE TO RELATED APPLICATION

The present application is based on Japanese priority application No. 2000-267634 filed on Sep. 4, 2000, the entire contents of which are hereby incorporated by reference.

BACKGROUND OF THE INVENTION

The present invention generally relates to laser diodes and more particularly to a laser diode of lateral-mode control type formed on a GaAs substrate.

Laser diodes that use AlInP or AlGaInP for the cladding layer have various advantageous features such as laser oscillation in a visible red wavelength band, capability of focusing the laser beam to a small spot, and the like, and are used extensively for the optical source of high-density optical disk recording apparatuses including a DVD apparatus.

AlInP or AlGaInP is a material that has the largest bandgap among the III-V materials that achieve a lattice matching with a GaAs substrate and are indispensable for the material of cladding layers of a laser diode that oscillates in a red wavelength band.

FIG. 1 is a diagram showing the construction of a typical conventional ridge-type laser diode 10 having an ordinary mesa structure that forms a refractive-index waveguide.

Referring to FIG. 1, the laser diode is constructed on an n-type GaAs substrate 11 and includes a buffer layer 12 of n-type GaAs formed on the substrate 11, a cladding layer 13 of n-type AlGaInP formed on the buffer layer 12 with a composition of $Al_{0.35}Ga_{0.15}In_{0.5}P$, and an active layer 14 of a strained multiple quantum well structure formed on the cladding layer 13.

The active layer 14 may be formed of alternate and repetitive stacking of a quantum well layer of GaInP having a thickness of 6 nm and a barrier layer of AlGaInP having a thickness of 4 nm and a composition of $Al_{0.2}Ga_{0.3}In_{0.5}P$, wherein the foregoing stacked structure forming the active layer 14 is vertically sandwiched by a pair of optical waveguide layers of AlGaInP having a thickness of 10 nm and a composition of $Al_{0.2}Ga_{0.3}In_{0.5}P$.

On the active layer 14, there is formed a cladding layer 15 of p-type AlGaInP having a composition represented as $Al_{0.35}Ga_{0.15}In_{0.5}P$, and an etching stopper layer 16 of p-type GaInP is formed on the cladding layer 15. Further, another cladding layer 17 of p-type AlGaInP having a composition of $Al_{0.35}Ga_{0.15}In_{0.5}P$ and an intermediate layer 18 of p-type GaInP are formed on the etching stopper layer 16 consecutively. Thereby, the cladding layer 17 and the intermediate layer 18 are patterned by a photolithographic process to form an ordinary mesa structure constituting a ridge structure extending axially through the laser diode, and a pair of current blocking regions 19 are formed at both lateral sides of the foregoing ridge structure.

On the current blocking regions 19 thus formed, there is formed a contact layer 20 of p-type GaAs such that the contact layer 20 makes a contact with the foregoing intermediate layer 18 on the top part of the foregoing mesa region.

The ridge-type laser diode of the foregoing construction is capable of realizing laser oscillation at a desired visible wavelength by using the strained multiple quantum well structure of GaInP/AlGaInP noted before for the active layer 14. Further, the use of the current blocking regions 19 at both lateral sides of the ridge structure extending at the central part of the laser diode in the axial direction thereof enables confinement of the driving current to the foregoing ridge structure. Further, the use of the GaAs current confinement regions 19 in combination with the ridge structure is effective for confinement of the optical radiation formed in the active layer 14 in the ridge structure and for guiding therethrough.

In such a conventional ridge-type laser diode, on the other hand, it is required to conduct a photolithographic process for forming the mesa structure. Further, it is required to form the current blocking regions 19 by way of regrowth of a GaAs layer. Thus, the conventional ridge-type laser diode has a drawback of needing a complicated fabrication process. In addition, the ridge-type laser diode of FIG. 1 has a drawback of increased threshold of laser oscillation caused as a result of optical absorption by the GaAs current blocking regions 19. Thus, the conventional ridge-type laser diode has suffered from the problem of poor efficiency of laser oscillation.

It is also known to modify the ridge-type laser diode of FIG. 1 by replacing the mesa structure with an inverse-mesa structure for reducing the device resistance. However, the foregoing problems cannot be avoided by such a modification of the conventional ridge-type laser diode.

Meanwhile, the inventor of the present invention has proposed, in the Japanese Laid-Open Patent Publication 06-045708, a so-called $S^3$ (self-aligned stepped substrate)-type laser diode 30 shown in FIG. 2.

Referring to FIG. 2, the laser diode 30 is formed on a GaAs substrate 31 of n-type, wherein the GaAs substrate 31 is formed with a stripe region of an inclined surface, which may be a (311)A surface or a (411)A surface. The substrate 31 is covered with a buffer layer 32 of n-type GaAs, wherein the buffer layer 32 forms a stripe region defined by an inclined surface in correspondence to the stripe region on the GaAs substrate 31. Further, the buffer layer 32 is covered by an intermediate layer 33 of n-type GaInP, wherein the intermediate layer 33 has an inclined stripe region formed in correspondence to the inclined stripe region on the buffer layer 32 and hence the inclined stripe region on the GaAs substrate 31.

On the intermediate layer 33, there is formed a cladding layer 34 of n-type AlGaInP in conformity with the underlying intermediate layer 33, wherein the cladding layer 34 thus formed includes an inclined stripe region in correspondence to the inclined stripe region on the intermediate layer 33.

On the cladding layer 34, there is formed an active layer 35 of a strained multiple quantum well structure similar to the active layer 14, in conformity with the underlying cladding layer 34, wherein the active layer 35 includes an inclined stripe region corresponding to the inclined stripe region formed on the cladding layer 34.

Further, a cladding layer 36 of p-type AlGaInP is formed on the active layer 35 in conformity with the underlying active layer 35, wherein the cladding layer 36 includes an inclined stripe region corresponding to the inclined stripe region formed on the active layer 35. The cladding layer 36 in turn is covered by a current confinement layer 37 of n-type AlGaInP formed in conformity with the underlying cladding layer 36, wherein the current confinement layer 37 includes an inclined stripe region corresponding to the inclined stripe region formed in the cladding layer 36.

Further, the current confinement layer 37 is covered by another cladding layer 38 of p-type AlGaInP in conformity with the current confinement layer 37, wherein the cladding layer 38 includes an inclined stripe region in correspondence to the inclined stripe region formed in the underlying current confinement layer 37. Further, the cladding layer 38 is covered with an intermediate layer 39 of p-type GaInP formed in conformity with the underlying cladding layer 38, wherein the intermediate layer 39 includes an inclined stripe region formed in correspondence to the inclined stripe region of the cladding layer 38. Further, the intermediate layer 39 is covered by a contact layer 40 of p-type GaAs formed in conformity with the underlying intermediate layer 39, wherein the contact layer 40 includes an inclined stripe region formed in correspondence to the inclined stripe region of the intermediate layer 39.

While not illustrated, the laser diode 30 of FIG. 2 further includes an n-type electrode at a bottom principal surface of the GaAs substrate 31 and a p-type electrode is formed on the contact layer 40.

The foregoing semiconductor layers 32–40 are formed consecutively on the substrate 31 thus formed with the inclined stripe region by an MOVPE process, wherein it becomes possible to dope the inclined stripe region of the current confinement layer 37 selectively to p-type and the remaining horizontal part to n-type by adding a p-type dopant such as Mg or Zn to the gaseous source during the MOVPE process of the current confinement layer 37, in addition to the n-type dopant such as Se or S.

FIG. 3 shows the efficiency of doping of various AlGaInP crystal surfaces by Mg and Zn, while FIG. 4 shows the efficiency of doping of various AlGaInP crystal surfaces by Se.

Referring to FIGS. 3 and 4, it can be seen that the efficiency of doping of Mg or Zn increases, in the AlGaInP layer, with increasing inclination angle toward the A-direction, while it can be seen also that the efficiency of doping of Se decreases with increasing inclination angle toward the A-direction.

FIG. 5 shows the relationship between the carrier concentration level (electron and hole concentration level) and the inclination angle for the AlInGaP layer that is doped simultaneously with a p-type dopant and an n-type dopant.

Referring to FIG. 5, it can be seen that there occurs a sharp decrease of electron concentration level in the AlGaInP layer when the inclination angle is increased toward the A-direction. Associated therewith, it can be seen that there occurs a sharp increase of hole concentration level with the increase of the inclination angle of the AlGaInP layer. Thus, the AlGaInP current confinement layer 37 is doped to n-type in the near-horizontal part having a surface orientation of (100) or a surface orientation near the (100) surface, while the AlGaInP current confinement layer 37 is doped to p-type in the inclined part having the (311)A or (411)A orientation.

It should be noted that such a structure can be realized also by an alternate approach such as depositing a thin p-doped layer and a thin n-doped layer alternately to form an alternate doping.

It should be noted that the foregoing $S^3$-type laser diode 30 is already used in practice as a high-output laser diode operable in the wavelength band of 685 nm. The laser diode 30 does not require a photolithographic patterning process except for the first step of forming the inclined surface on the GaAs substrate 31, and can also eliminate the mask process and regrowth process that have been necessary in the fabrication process of the conventional ridge-type laser diode 10 when forming the current blocking regions 19. Thus, the laser diode 30 can be fabricated easily by a simple process with high yield.

By using the current confinement layer 37 thus formed, the carriers are injected selectively into the inclined stripe region of the active layer 35 and photoemission takes place in the inclined stripe region efficiently. Thereby, it should be noted that the inclined stripe region of the active layer 35 is laterally and vertically sandwiched by the AlGaInP cladding layers 34 and 36 that have a small refractive index, and there is formed an optical waveguide surrounding the inclined stripe region by the difference of the refractive index. In such a refractive-index optical waveguide, the problem of optical absorption and associated problem of increase of laser oscillation threshold that tend to appear in the case of using a complex-refractive-index optical waveguide, which uses optical absorption for the formation of the optical waveguide structure, is effectively eliminated. Further, the $S^3$-type laser diode 30 has an advantageous feature of small astigmatism.

On the other hand, when the $S^3$-type laser diode 30 is to be used for the optical source of recent optical disk apparatuses such as a DVD apparatus, in which a laser oscillation with a wavelength of 665 nm or less is required, it was found that there arises a problem of degradation of the characteristic temperature To in the case that the laser diode is operated at the temperature of 60–70° C. Further, it was found that the differential efficiency of the injected current is also deteriorated, and there has been a difficulty in the conventional $S^3$-type laser diode 30 of obtaining a large optical output. It should be noted that the characteristic temperature is an index representing the temperature dependence of the threshold current of laser oscillation. Larger the characteristic temperature To, smaller the temperature dependence of the operational characteristic of the laser diode. Thus, a laser diode having a large characteristic temperature To can operate stably without providing a particular temperature regulation.

FIG. 6 is a band diagram that represents the mechanism of the degradation of the temperature characteristic of the laser diode 30 for the state in which a bias voltage is applied to the level of causing a laser oscillation.

Referring to FIG. 6, it can be seen that the electrons injected into the n-type GaAs substrate 31 from the n-type electrode are transported along the conduction band Ec of the n-type cladding layer 34 and are accumulated in the quantum level E of the quantum well layer formed in the active layer 35. Further, the holes h injected into the p-type GaAs contact layer 40 from the p-type electrode are transported along the valence band Ev of the p-type cladding layer 36 and are accumulated in the quantum level H of the quantum well layer in the active layer 35. As a result of the recombination of the electrons and holes thus accumulated in the quantum well layer caused by the mechanism of stimulated emission, there occurs an amplification of optical radiation, which leads to the desired laser oscillation when a certain threshold of optical radiation is exceeded.

The degradation of the temperature characteristic of the laser diode is caused when the electrons e thus injected into the active layer 35 experience a thermal excitation to the level exceeding the height of the potential difference between the quantum level E of the active layer 35 and the conduction band energy Ec of the p-type cladding layer 36, wherein the foregoing barrier height can be represented as $\Delta Ec + E_{bilt-p}$, the term $E_{bilt-p}$ representing the p-side component of the difference between the built-in potential and the bias voltage for the laser oscillation. The electrons thus excited cause an overflowing to the p-type cladding layer 36 without causing recombination with the holes in the active layer 35.

FIG. 7 shows the current path inside the $S^3$-type laser diode 30 of FIG. 2, wherein those parts of FIG. 7 corresponding to the parts described previously are designated by the same reference numerals and the description thereof will be omitted.

Referring to FIG. 7, it can be seen that the current confinement layer 37 includes a p-type inclined region 37A that provides a confined current path for the injected driving current. Thus, the electric current injected from the p-type electrode to the contact layer 40 is finally injected into an inclined region 35A of the active layer 35 after passing through the foregoing inclined region 37A of the current confinement layer 37 and further a corresponding inclined region 36A of the cladding layer 36 as represented in FIG. 7 by a current path $I_1$.

Thereby, a part of the electric current thus passed through the inclined region 37A of the current confinement layer 37 may cause a lateral diffusion in the cladding layer 36 as represented in FIG. 7 by a current path $I_2$, wherein the electric current thus diffused is injected to a horizontal part 35B of the active layer 35 via a corresponding horizontal part 36B of the cladding layer 36. Here, it is assumed that there is no overflowing of electrons explained with reference to FIG. 6 taking place in the active layer 35.

In the active layer 35, it should be noted that there exists a further current path $I_3$ inside the active layer 35. Thus, a part of the holes injected into inclined region 35A of the active layer 35 may escape to the horizontal part 35B along the current path $I_3$. However, such an escape of the holes from the inclined region 35A to the horizontal part 35B of the active layer 35 may be suppressed due to the increased hole concentration level in the horizontal part 35B of the active layer 35 caused by the injection of the holes to the horizontal part 35B along the current path $I_2$ explained previously.

In the inclined region 35A of the active layer 35, there is caused a depletion of carriers as a result of the stimulated emission, and thus, there is caused a reverse flow of holes from the horizontal part 35B where the hole concentration level is large, to the inclined region 35A where the holes are depleted. From the reasons noted above, the $S^3$-type laser diode 30 of FIG. 2 can cause laser oscillation with high efficiency even when there is caused a diffusion of electrons along the current path $I_2$, provided that there is no overflow of electrons in the active layer 35.

When there is caused the problem of overflow of electrons explained with reference to FIG. 6, on the other hand, the holes flowing through the cladding layer 36 along the current path $I_2$ cause a recombination with the overflowing electrons in the horizontal region 36B of the cladding layer 36, and the mechanism of suppressing the escaping of the holes from the inclined region 35A of the active layer 35 is lost. As a result, there occurs an increase of threshold of laser oscillation in the laser diode 30 and it becomes no longer possible to obtain a large optical output from the laser diode 30.

It should be noted that the problem of overflowing of the electrons appears most significantly when the laser oscillation wavelength is shifted to a short wavelength band of 665 nm band.

SUMMARY OF THE INVENTION

Accordingly, it is a general object of the present invention to provide a novel and useful laser diode and fabrication process thereof wherein the foregoing problems are eliminated.

Another object of the present invention is to provide a so-called $S^3$-type layer diode oscillating efficiently in the wavelength band of 665 nm or less and the fabrication process thereof.

Another object of the present invention is to provide a laser diode, comprising:

a substrate including an inclined surface region on a principal surface thereof;

an active layer formed on said substrate and including an inclined surface region corresponding to said inclined surface region of said substrate;

a first cladding layer of p-type formed on said active layer and including an inclined surface region corresponding to said inclined surface region of said active layer;

a second cladding layer formed on said first cladding layer and including an inclined surface region of p-type corresponding to said inclined surface region of said first cladding layer, said second cladding layer further including a horizontal region of n-type adjacent to said inclined surface region of p-type, said horizontal region extending parallel to said principal surface of said substrate;

a first electrode connected electrically to said substrate; and a second electrode connected electrically to said inclined surface region of said second cladding layer, said inclined surface region of said first cladding layer having a carrier concentration level of $1 \times 10^{18}$ cm$^{-3}$ or more, said first cladding layer having a thickness of 0.35 µm or more.

Another object of the present invention is to provide a laser diode, comprising:

a substrate including an inclined surface region on a principal surface thereof;

an active layer formed on said substrate, said active layer including an inclined surface region corresponding to said inclined surface region of said substrate;

a first cladding layer of p-type formed on said active layer, said first cladding layer including an inclined surface region corresponding to said inclined surface region of said active layer, a second cladding layer formed on said first cladding layer, said second cladding layer including an inclined surface region of p-type corresponding to said inclined surface region of said first cladding layer, said second cladding layer further including a horizontal region of n-type adjacent to said inclined surface region of p-type, said horizontal region being parallel to said principal surface of said substrate;

a first electrode connected electrically to said substrate; and a second electrode connected electrically to said inclined surface region of said second cladding layer, said inclined surface region of said first cladding layer having a carrier concentration level of $1 \times 10^{18}$ cm$^{-3}$ or more, said first cladding layer comprising an AlGaInP film containing Al with a ratio to Ga of 0.7:0.3 or more.

Another object of the present invention is to provide a laser diode, comprising:

a substrate including an inclined surface region in a principal surface thereof;

an active layer formed on said substrate, said active layer including an inclined surface region corresponding to said inclined surface region of said substrate;

a first cladding layer of p-type formed on said active layer, said active layer including an inclined surface region corresponding to said inclined surface region of said active layer;

a second cladding layer formed on said first cladding layer, said second cladding layer including a p-type inclined surface region corresponding to said inclined surface region of said first cladding layer, said second cladding layer including a horizontal region of n-type adjacent to said p-type inclined surface region, said horizontal region extending parallel to said principal surface of said substrate, a first electrode connected electrically to said substrate; and a second electrode connected electrically to said inclined surface region of said second cladding layer, said inclined surface region of said first cladding layer having a carrier concentration level of $1 \times 10^{18} cm^{-3}$ or more, at least a part of said first cladding layer having a bandgap larger than a bandgap of an AlGaInP film having a composition of $(Al_{0.7}Ga_{0.3})_{0.5}In_{0.5}P$.

Another object of the present invention is to provide a laser diode, comprising:

a substrate having an inclined surface region on a principal surface thereof;

an active layer formed on said cladding layer, said active layer including an inclined surface region corresponding to said inclined surface region of said substrate;

a first cladding layer formed on said active layer, said first cladding layer including an inclined surface region corresponding to said inclined surface region of said active layer;

a second cladding layer formed on said first cladding layer, said second cladding layer including an inclined surface region of p-type corresponding to said inclined surface region of said first cladding layer and a pair of n-type regions adjacent to said p-type inclined surface region at both lateral sides thereof, said n-type regions extending parallel with said principal surface of said substrate;

a first electrode connected electrically to said substrate; and a second electrode connected electrically to said inclined surface region of aid second cladding layer, said inclined surface region of said first cladding layer having a carrier concentration level of $1 \times 10^{18}$ $cm^{-3}$ or more, said second cladding layer having a thickness of 0.35 $\mu m$ or more.

Another object of the present invention is to provide a method of fabricating a laser diode, comprising the steps of:

forming an active layer on a substrate having an inclined surface region in a part of a principal surface thereof by an MOVPE process;

forming a first cladding layer of p-type on said active layer by an MOVPE process; and forming a second cladding layer on said first cladding layer by an MOVPE process while supplying an n-type dopant and a p-type dopant simultaneously, such that said second cladding layer has p-type in an inclined surface region thereof corresponding to said inclined surface region of said substrate and such that said second cladding layer has n-type in a horizontal region thereof parallel to said principal surface.

According to the present invention, it becomes possible to increase the band discontinuity at the boundary between the p-type inclined surface region of the cladding layer and the n-type horizontal region adjacent to the p-type inclined surface region, by setting the carrier concentration level of the p-type cladding layer disposed between the active layer and the current confinement layer of a so-called $S^3$-type laser diode to be $1 \times 10^{18}$ $cm^{-3}$ and by setting the thickness of the p-type cladding layer to be 0.35 $\mu m$ or more. As a result, the problem of electron overflow is suppressed effectively and the temperature characteristic of the laser diode is improved, and the laser diode of the present invention can provide a large optical output power of 50–70 mW in the wavelength band of 660 nm or less, even when the the laser diode is operated at the temperature of 60–70° C.

Other objects and further features of the present invention will become apparent from the following detailed description when read in conjunction with the attached drawings.

DETAILED DESCRIPTION OF THE INVENTION

PRINCIPLE

Figure 1:
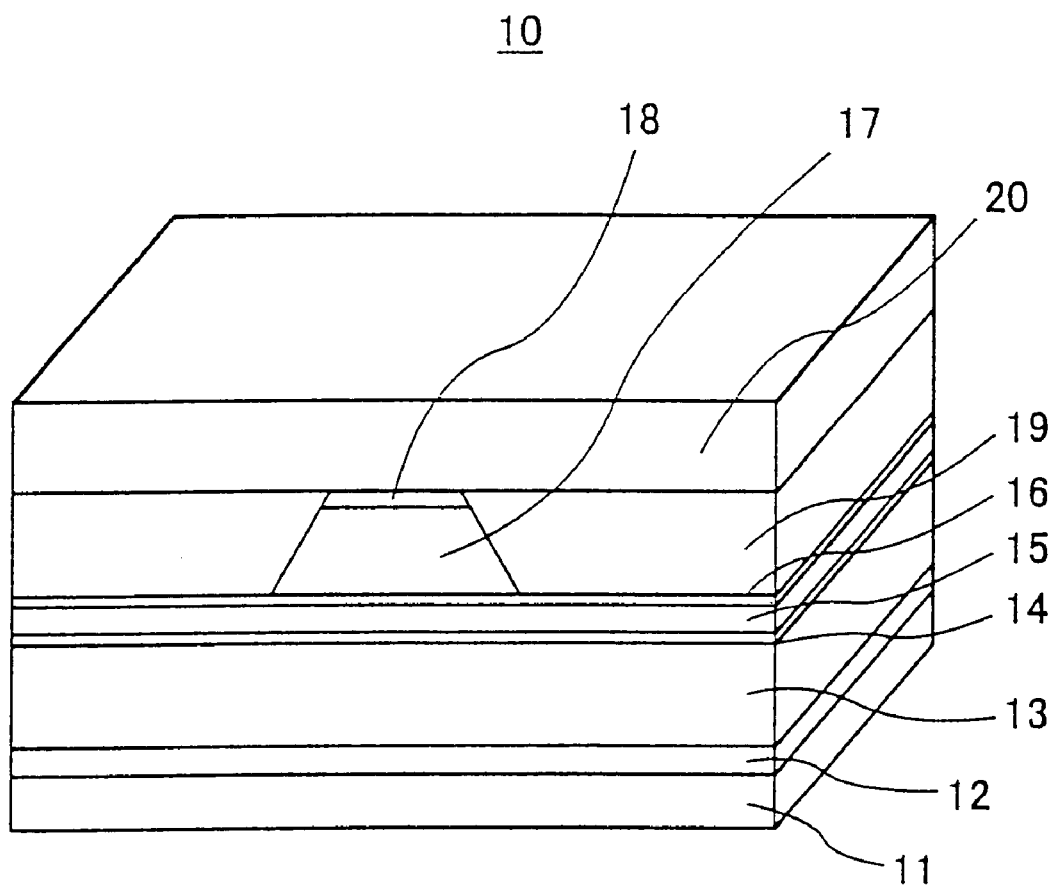
FIG. 1 is a diagram showing the construction of a conventional ridge-type laser diode.
Figure 2:
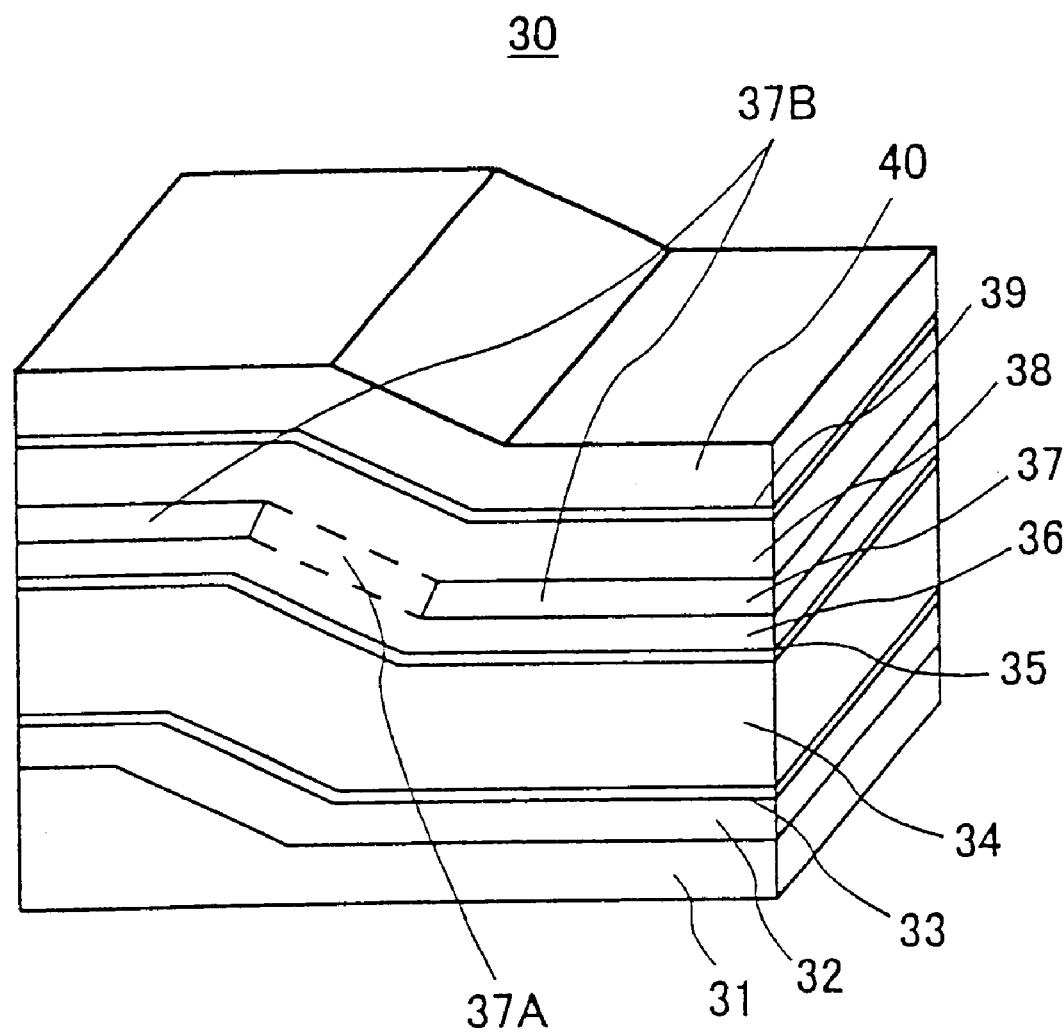
FIG. 2 is a diagram showing the construction of a conventional $S^3$-type laser diode.
Figure 3:
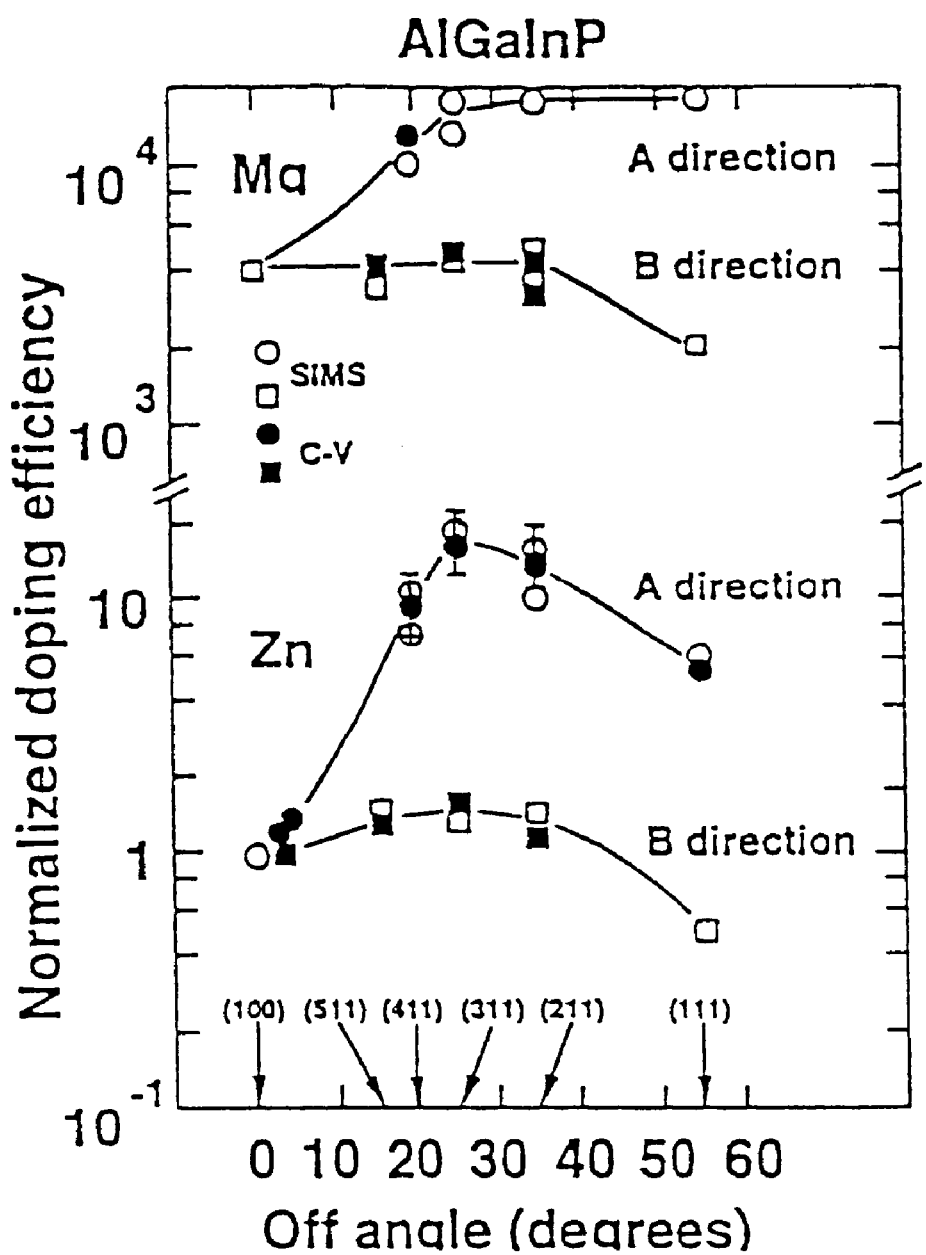
FIG. 3 is a diagram explaining the relationship between the efficiency of doping of a p-type dopant used in the $S^3$-type laser diode of FIG. 2 and the crystal surface subjected to doping by the p-type dopant.
Figure 4:
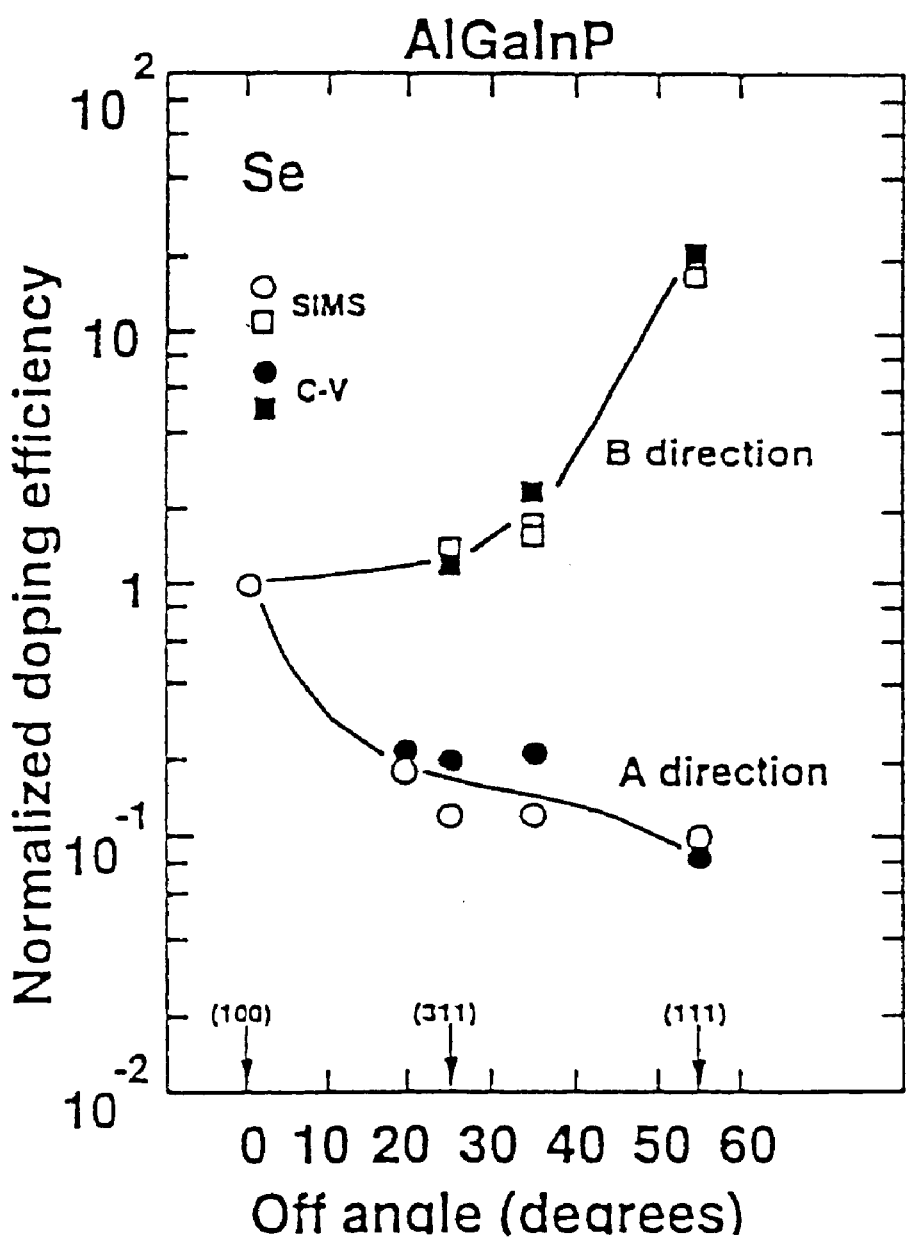
FIG. 4 is a diagram explaining the relationship between the efficiency of doping of an n-type dopant used in the $S^3$-type laser diode of FIG. 2 and the crystal surface subjected to doping by the n-type dopant.

Hereinafter, the principle of the present invention will be explained with reference to FIG. 8, wherein those parts corresponding to the parts described previously are designated by the same reference numerals and the description thereof will be omitted. For the sake of simplicity, the intermediate layers 33 and 39 are omitted in FIG. 8.

Figure 6:
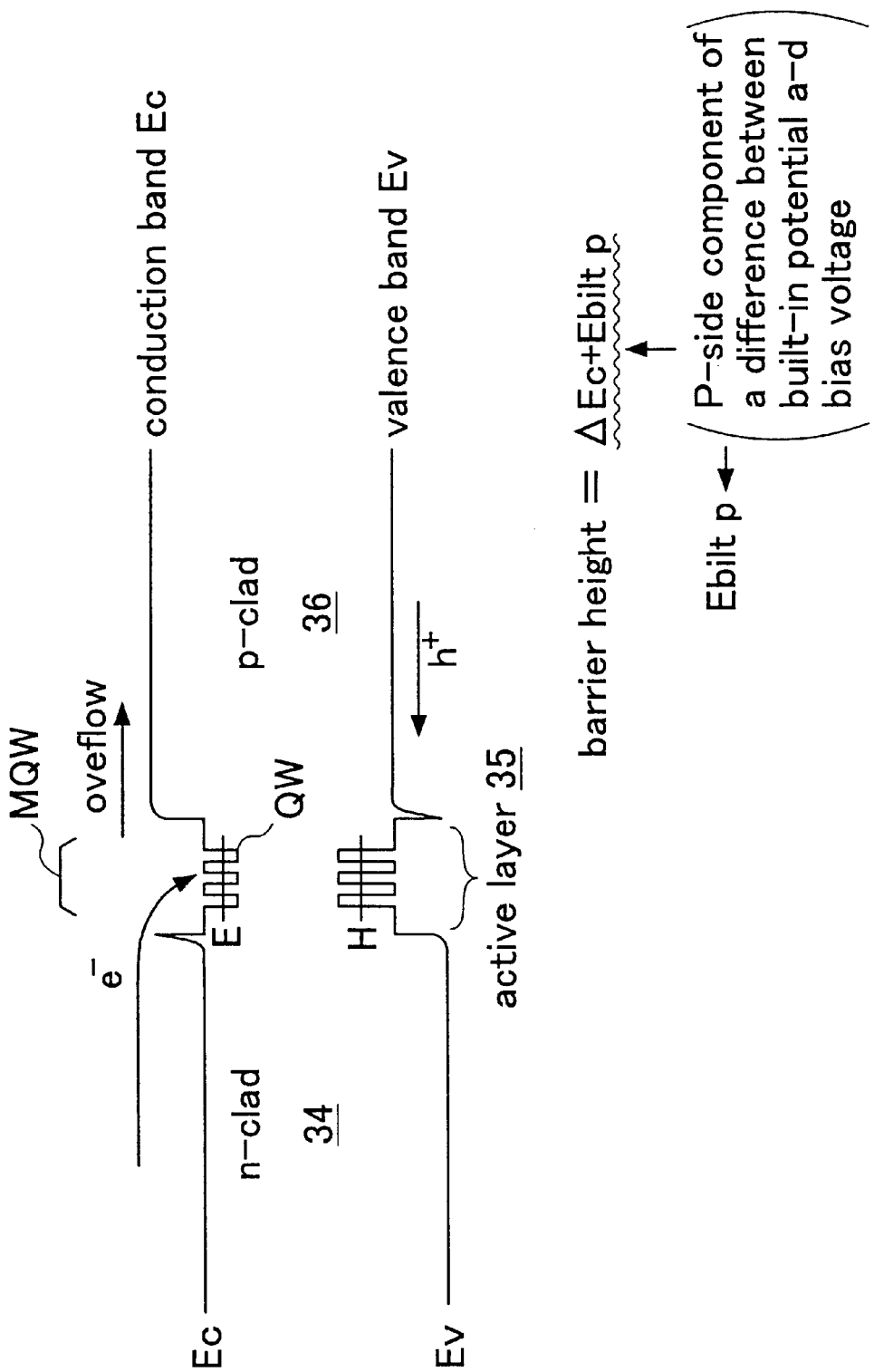
FIG. 6 is a band diagram showing the carrier overflowing occurring in the laser diode of FIG. 2.
Figure 7:
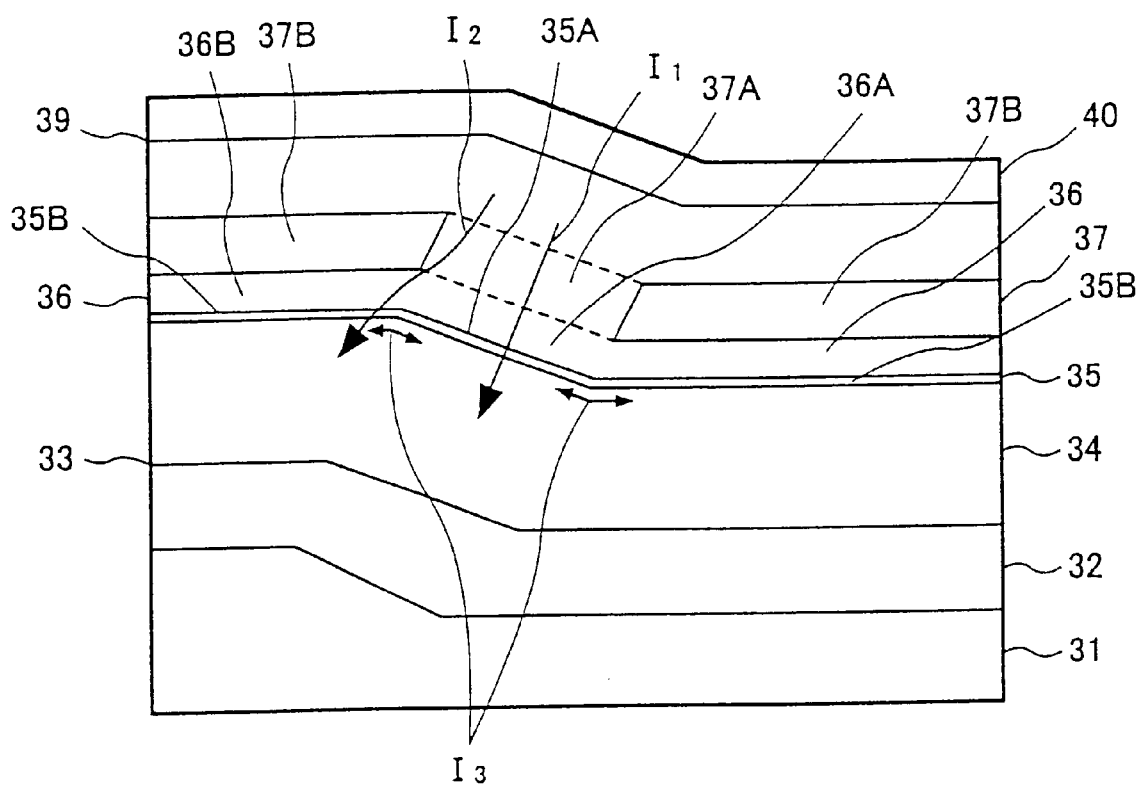
FIG. 7 is a diagram showing the current path of injection current in the laser diode of FIG. 2.

First, reference is made to the band diagram of FIG. 6.

Referring to the band diagram of FIG. 6, the problem of overflowing of the electrons that have been injected into the active layer 35 can be avoided by increasing the Al content in the p-type cladding layer 36 such that the bandgap of the p-type cladding layer 36 is increased with respect to the n-type cladding layer 34. However, such an approach, while being successful in suppressing the carrier overflowing, raises another problem of asymmetric refraction index profile inside the laser diode with respect to the active layer 35. More specifically, the refractive index profile in the laser diode is no longer symmetric vertically as well as laterally with respect to the active layer 35, and there is caused an adversary effect in optical confinement in the laser diode. Further, the use of a widegap material for the p-type cladding layer 36 increases the resistance of the laser diode.

Meanwhile, it is noted that the problem of overflowing of the carriers is caused mainly in the conduction band Ec. Thus, it is also possible to suppress the carrier overflowing by shifting the energy of the conduction band Ec in the higher energy side. In order to achieve this, it is necessary to cause the Fermi level of the p-type cladding layer 36 to locate near the bottom edge energy (Ec) of the conduction band.

Figure 8:
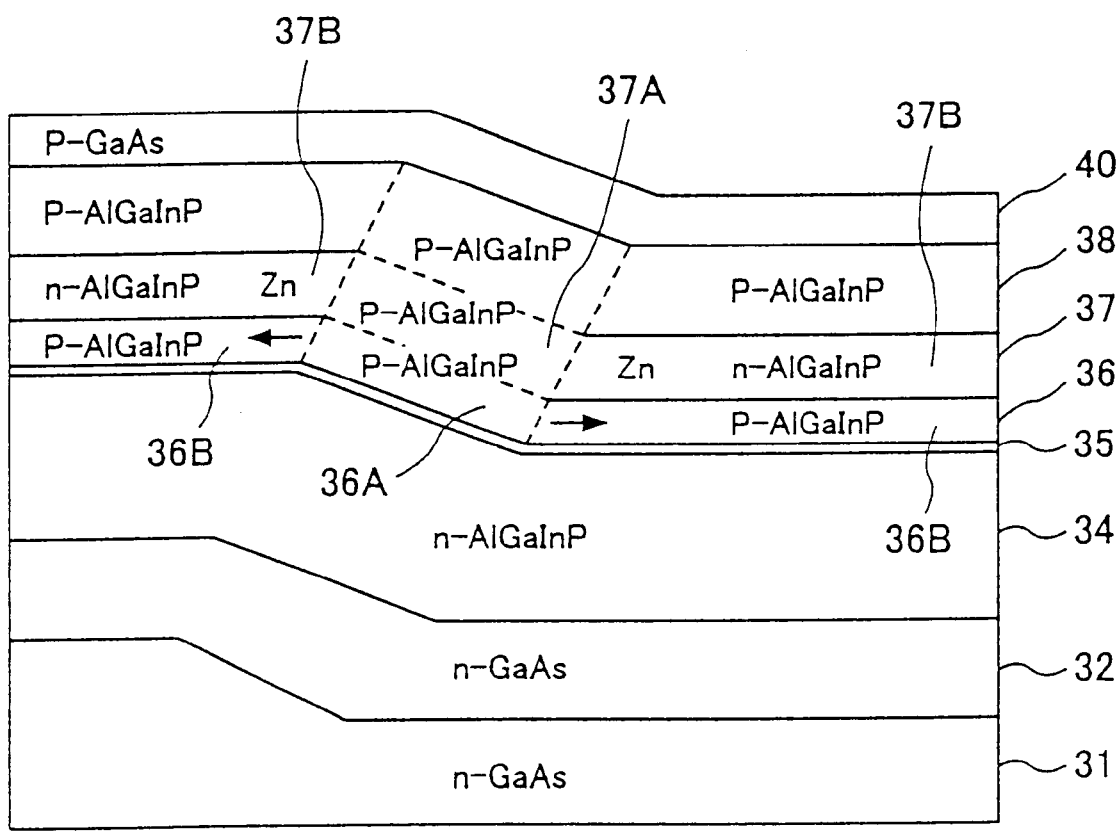
FIG. 8 is a diagram explaining the principle of the present invention.

Thus, the present invention achieves the desired suppressing of the carrier overflowing in the $S^3$-type laser diode represented in FIG. 8 by increasing the concentration level of the p-type dopant in the p-type cladding layer 36. By increasing the dopant concentration level in the p-type cladding layer 36, the carrier concentration level is increased correspondingly, and the Fermi level approaches the conduction band energy Ec.

Figure 9:
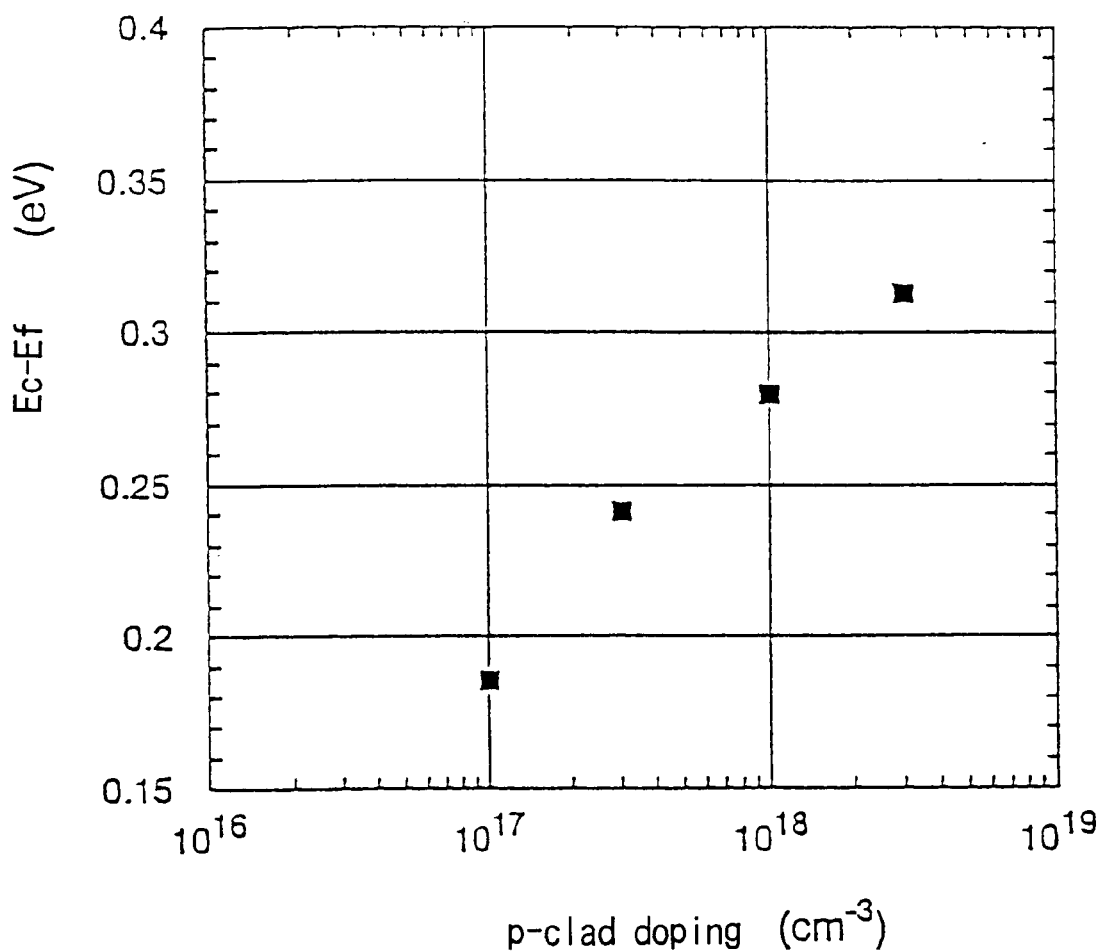
FIG. 9 is another diagram explaining the principle of the present invention.

FIG. 9 shows the relationship between the p-type dopant concentration level and the conduction band energy Ec in the cladding layer 36. In FIG. 9, it should noted that Zn is used for the p-type dopant, and thus, the horizontal axis of FIG. 9 represents the Zn concentration level in the cladding layer 36. Further, the vertical axis represents the conduction band energy Ec of the cladding layer 36 as measured from the electron quantum level Ef in the quantum well layer under the oscillation state of the laser diode, and hence the pseudo-Fermi level of the electrons. Thus, the vertical axis of FIG. 9 represents the quantity (Ec–Ef).

As can be seen in FIG. 9, the conduction band energy Ec of the cladding layer 36 increases with increasing concentration level of the p-type dopant therein.

Figure 10:
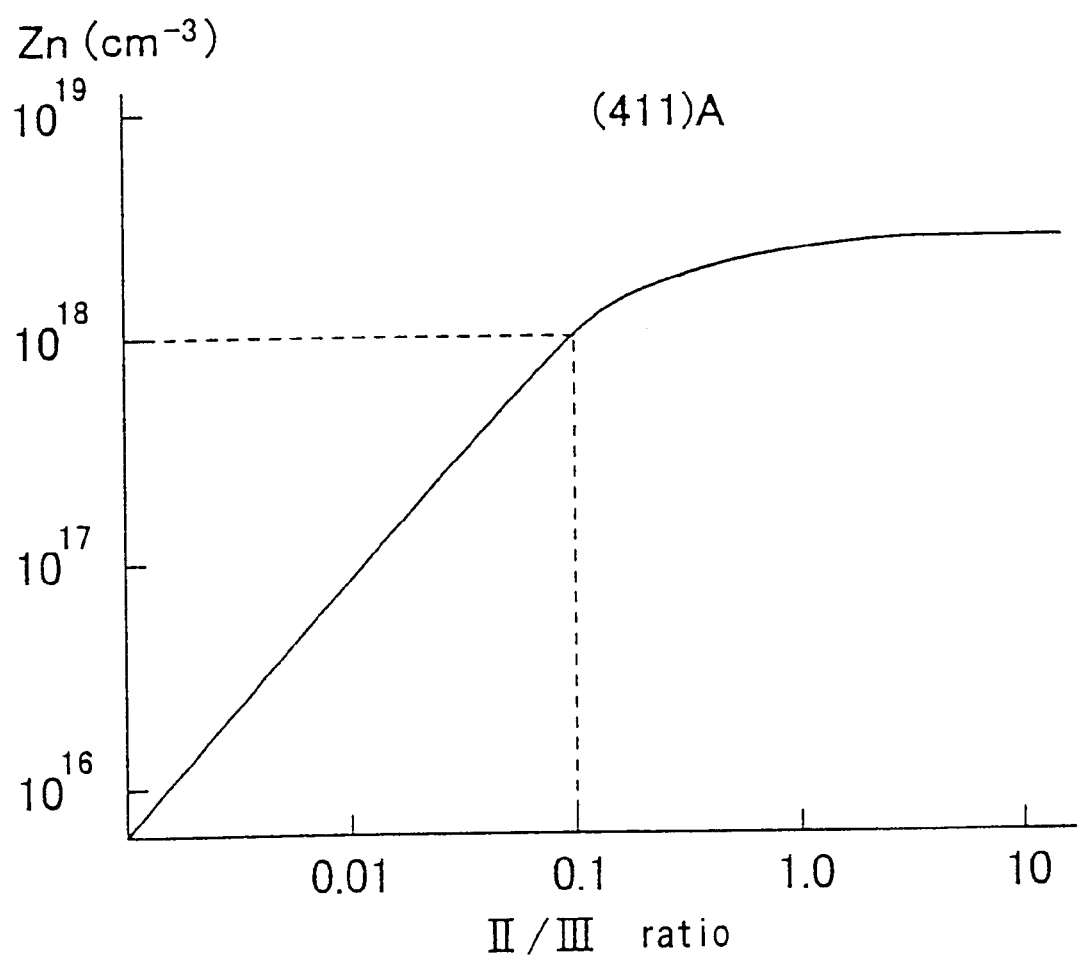
FIG. 10 is a further diagram explaining the principle of the present invention.

FIG. 10 shows the efficiency of doping of the AlGaInP cladding layer 36 when doped by a p-type dopant at the time the AlGaInP cladding layer 36 is formed by an MOVPE process, wherein FIG. 10 shows the efficiency of doping for various doping levels. It should be noted that the result of FIG. 10 is for the (411)A surface.

Referring to the logarithmic plot of FIG. 10, it can be seen that the amount of Zn that is incorporated into the cladding layer 36 increases generally linearly when the proportion of the Zn gaseous source (DEZn: $(C_2H_5)_2Zn$) with respect to the gaseous source of a group III element is increased at the time of the MOVPE growth of the p-type cladding layer 36. FIG. 10 also indicates that the Zn concentration in the layer 36 starts to saturate when the Zn concentration level in the layer 36 has exceeded the level of $10^{18}$ $cm^{-3}$.

In view of the fact that the supply of Zn to the cladding layer 36 itself has been increased, the result of FIG. 10 suggests that there is caused a diffusion of Zn from the inclined surface region 36A of the AlGaInP cladding layer 36, in which the Zn concentration level has increased a level exceeding $10^{18}$ $cm^{-3}$, to the horizontal region 36B where the Zn concentration level is lower, as represented in FIG. 8 by arrows. In a III-V semiconductor layer, it is known that the diffusion coefficient of a p-type impurity element increases with the concentration level thereof (S. N. G. Chu and R. A. Logan, J. Appl. Phys. vol. 78, pp. 3001–3007).

As a result of such a diffusion of Zn in the cladding layer 36 from the inclined surface region 36A to the horizontal region 36B, there is formed a high-concentration region 36b of Zn in the $S^3$-type laser diode in correspondence to the horizontal part 36B of the AlGaInP cladding layer 36, such that the high-concentration region 36b is located adjacent to the inclined surface region 36A. It should be noted that there is caused a shift of the conduction band Ec of the cladding layer 36 to higher energy side in the band diagram of FIG. 6 in such a high-concentration region 36b, and the overflowing of the electrons into the region 36b is effectively suppressed.

Associated therewith, the holes injected into the contact layer 40 are concentrated to the inclined surface region 36A of the cladding layer 36, and the temperature characteristic of the laser diode is improved.

Figure 12:
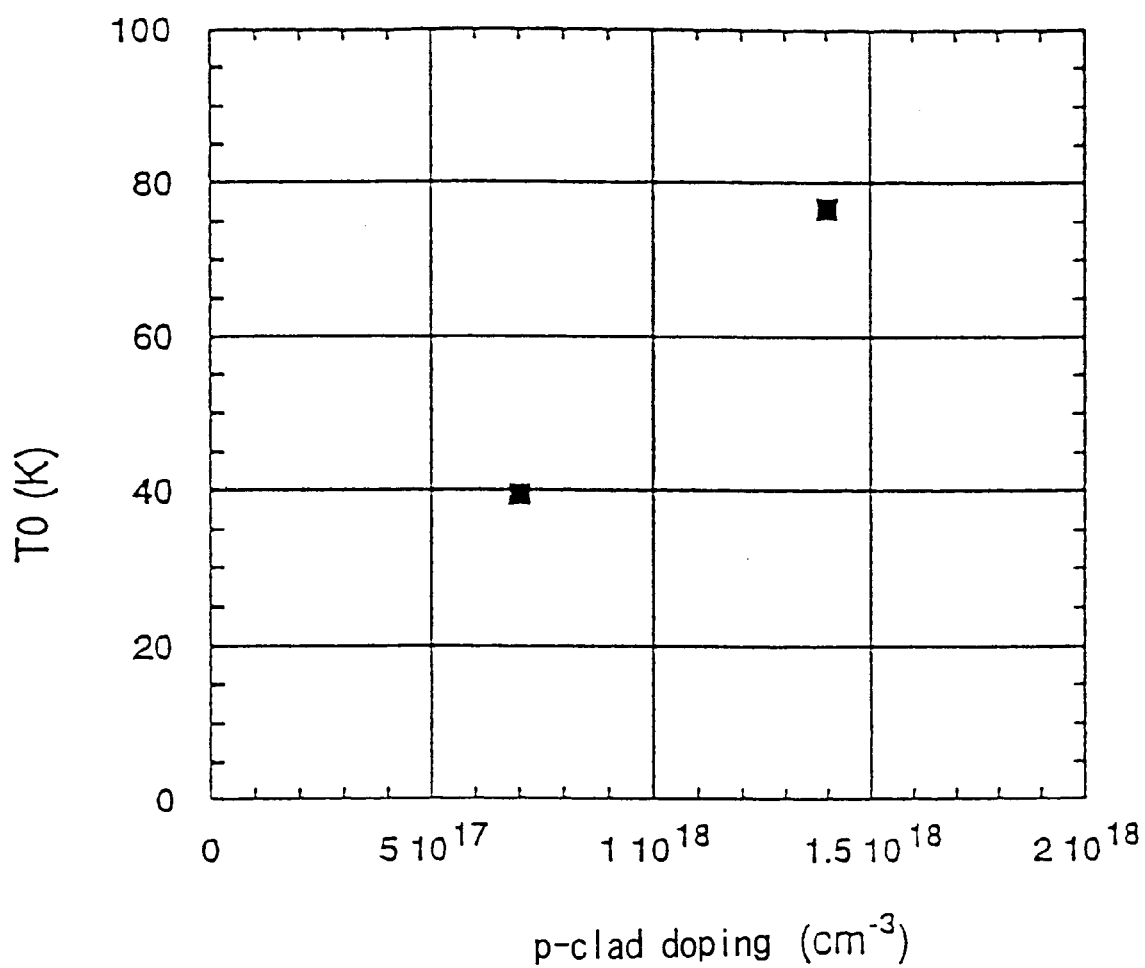
FIG. 12 is a further diagram explaining the principle of the present invention.

FIG. 12 shows the relationship between the concentration level of the p-type dopant introduced into the inclined surface region 36A of the cladding layer 36 and the characteristic temperature To of the laser diode.

Figure 11:
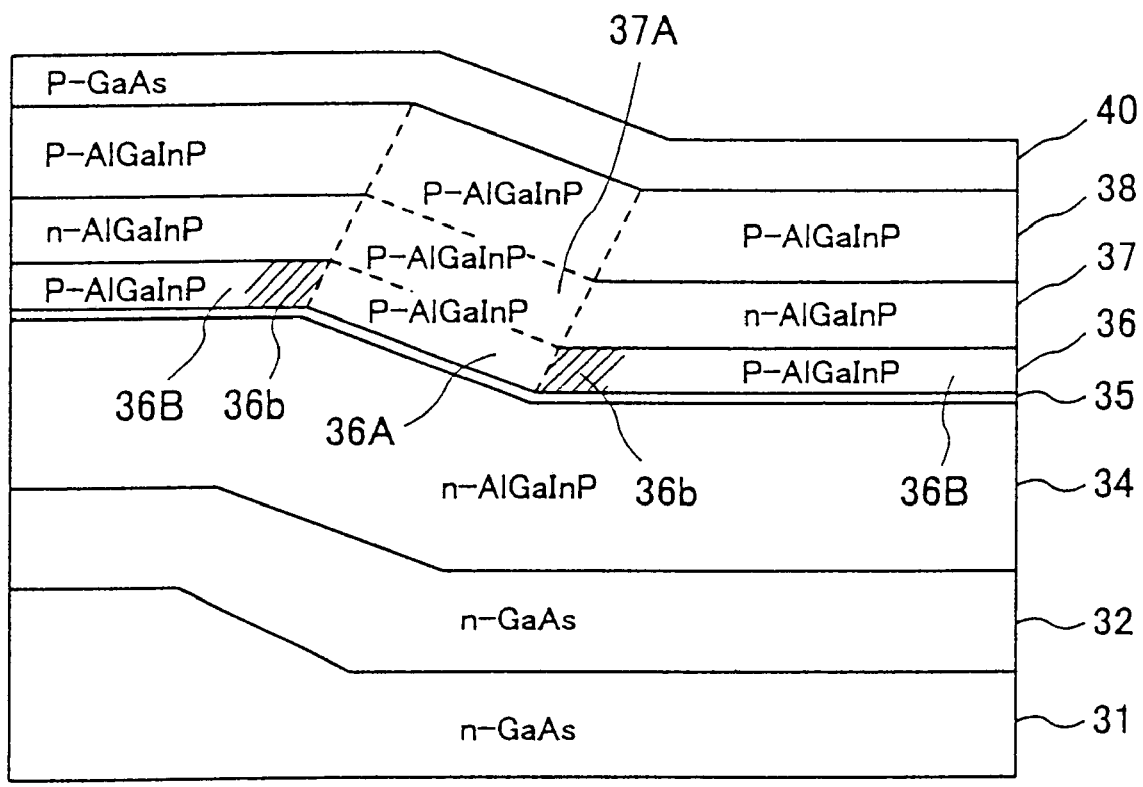
FIG. 11 is a further diagram explaining the principle of the present invention.

Referring to FIG. 12, it can be seen that the characteristic temperature of the laser diode increases with increasing p-type dopant concentration level, indicating that there is caused the suppression of electron overflow as a result of the formation of the high-concentration region 36b of FIG. 11.

In the $S^3$-type laser diode of FIG. 11, there is a concern, in view of the structural features thereof in which the p-type cladding layer 36 is located adjacent to the active layer 35, in that Zn thus introduced into the cladding layer 36 may cause a diffusion also into the active layer 35 and induce a degradation of crystal quality of the active layer 35 in which the optical emission is caused. In order to suppress the penetration of Zn into the active layer 35 and simultaneously to promote lateral diffusion of Zn in the cladding layer 36, there is a need of optimizing the thickness of the cladding layer 36.

Figure 13:
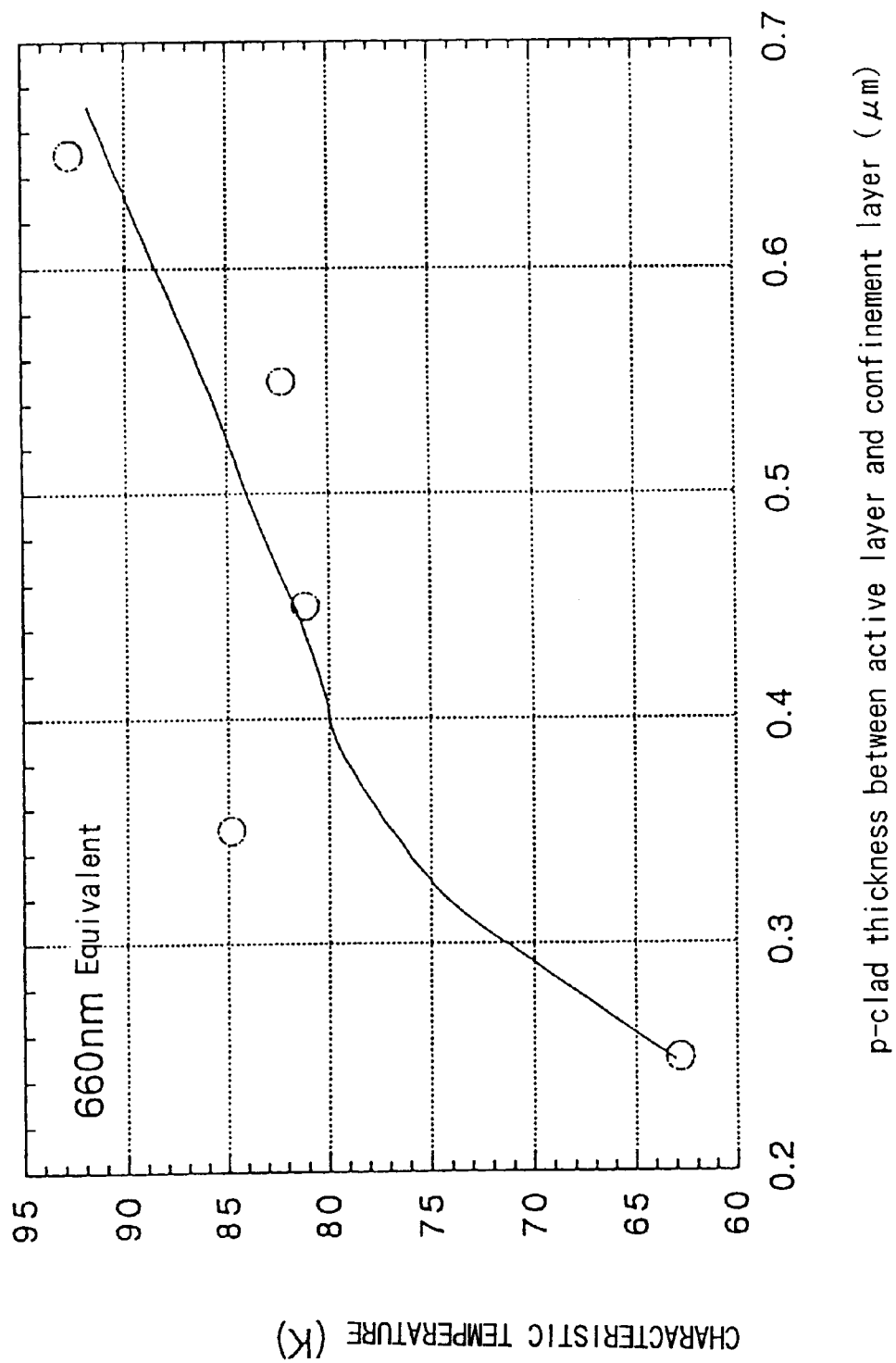
FIG. 13 is a further diagram explaining the principle of the present invention.

FIG. 13 shows the characteristic temperature To of the laser diode of FIG. 11 in which the thickness of the cladding layer 36, which is doped with Zn to the concentration level of $1\times10^{18}$ $cm^{-3}$, is changed variously.

Referring to FIG. 13, it can be seen that the characteristic temperature To of the laser diode takes a small value of about 63K when the cladding layer 36 has a thickness of 0.25 μm. When the thickness of the cladding layer 36 is increased to 0.35 μm or more, on the other hand, it can be seen that the characteristic temperature To increases to 80K or more. This effect is interpreted as reflecting the effect of increase of thickness of the boundary region formed between the inclined surface region 36A and the horizontal region 36B, in other words the effect of the size of the diffusion window, caused as a result of increase of thickness of the cladding layer 36. Thus, it is concluded that the cladding layer 36 is formed with a thickness of 0.35 μm or more.

Further, from the result of a SIMS analysis, it was found that the diffusion of Zn from the cladding layer 36 to the active layer 35 can reach a depth of about 30 nm when the cladding layer 36 is doped to a concentration level of $1.5\times10^{18}$ $cm^{-3}$. This means that the penetration of Zn into the active layer 35 can be avoided effectively when the cladding layer 36 is formed first in an undoped state with a thickness of about 50 nm or more and the Zn doping is conducted thereafter.

In the laser diode of FIG. 11, it is also possible to suppress the overflow of electrons by increasing the Al concentration level in the cladding layer 36.

Figure 14:
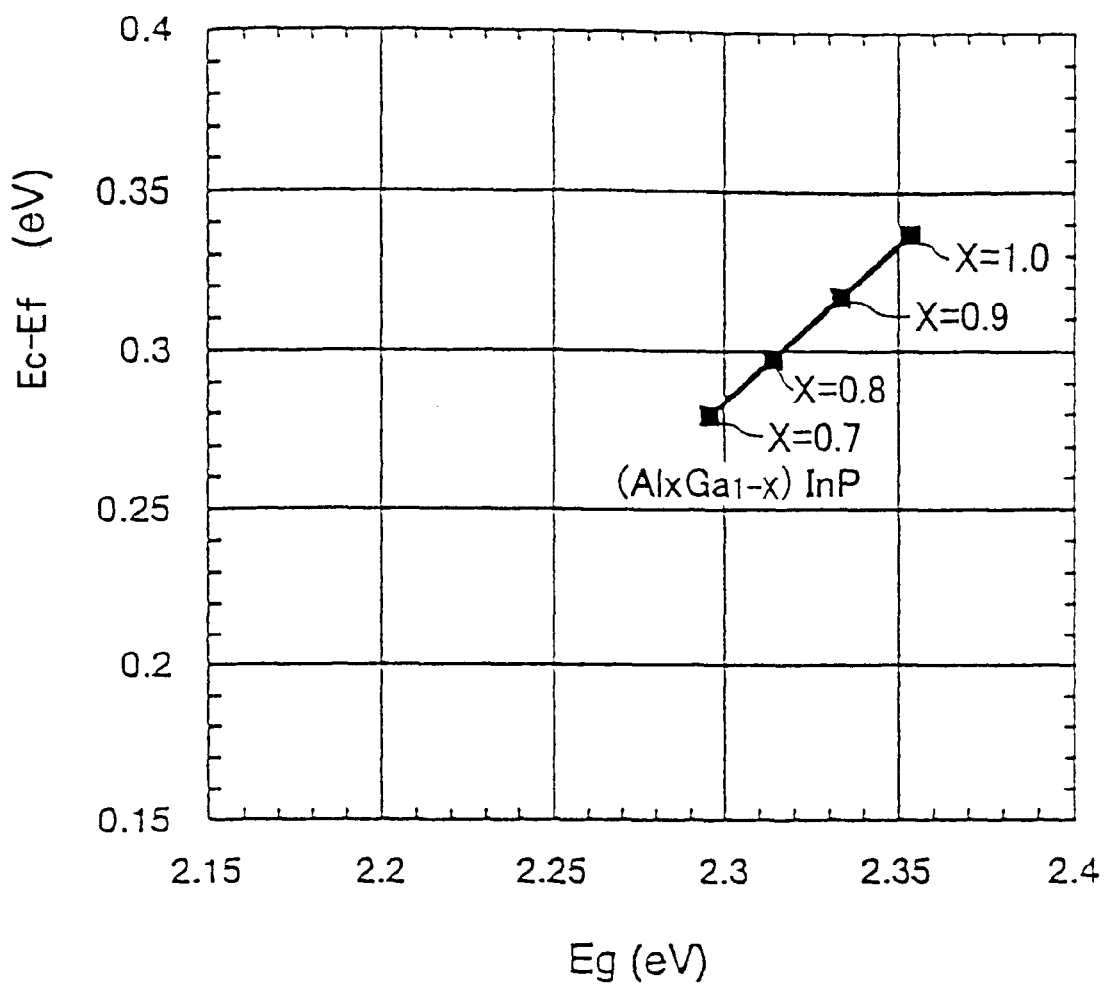
FIG. 14 is a further diagram explaining the principle of the present invention.

FIG. 14 shows the relationship between the bandgap Eg of the AlGaInP cladding layer 36 that has a composition represented as $(Al_xGa_{1-x})InP$ and the shift of the conduction band energy Ec for the case in which compositional parameter x is changed in the range of 0.7–1.0.

Thus, by increasing the p-type dopant concentration level in the AlGaInP cladding layer 36 according to the relationship of FIG. 9 and by increasing the Al content according to the relationship of FIG. 14, it is possible to achieve the desired current confinement effect. As noted previously, such an increase of the Al content in the cladding layer 36 tends to invite problem with regard to optical confinement or device resistance. Thus, it is thought essential and inevitable, in the $S^3$-type laser diode that tends to cause the problem of carrier overflow, to use the increase of the dopant concentration level represented in FIGS. 9 and 11 in order to achieve the desired current confinement.

EMBODIMENT

Next, the fabrication process of the laser diode according to a first embodiment of the present invention will be described with reference to FIGS. 15A–15J. It should be noted that FIGS. 15C–15J represent the laser diode to be fabricated in an end view.

Figure 15A:
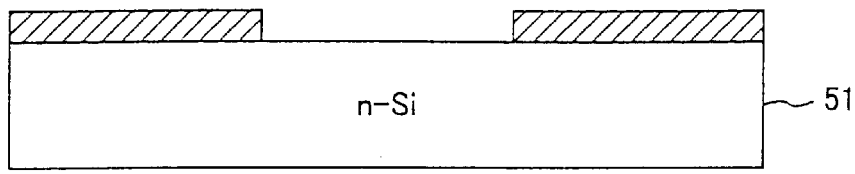
FIGS. 15A–15J are diagrams showing the fabrication process of an $S^3$-type laser diode according to an embodiment of the present invention.

Referring to FIG. 15A, a resist film is applied on an GaAs substrate 51 of 3 or 4 inch diameter, wherein the GaAs substrate 51 is doped with Si to a concentration level of about $2\times10^{18}$ cm$^{-3}$. By conducting an exposure process to the resist film thus applied, there are formed a number of stripe-form resist patterns each having a width of 100 μm, with an interval of 100 μm. The GaAs substrate 51 is actually an off-substrate and may have an inclined principal surface that is inclined to the <111>A direction from the (100) surface by an angle of about 6°.

Figure 15B:
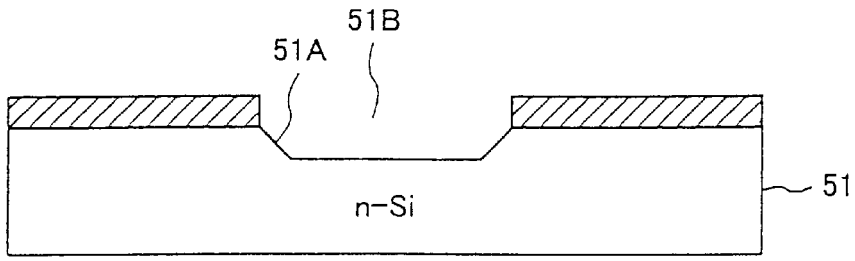

Next, in the step of FIG. 15B, the GaAs substrate 51 thus formed with the resist patterns is subjected to a wet etching process in an etchant containing HF, and there are formed grooves 51B on the surface of the GaAs substrate 51 with a depth of about 0.5 μm such that each groove 51B is defined by an inclined surface region 51A, wherein the inclined surface region 51A may be defined by (411)A-(311)A surface inclined from the (100) surface by an angle of about 14–20° or a crystal surface near the (411)A (311)A surface.

Figure 15C:
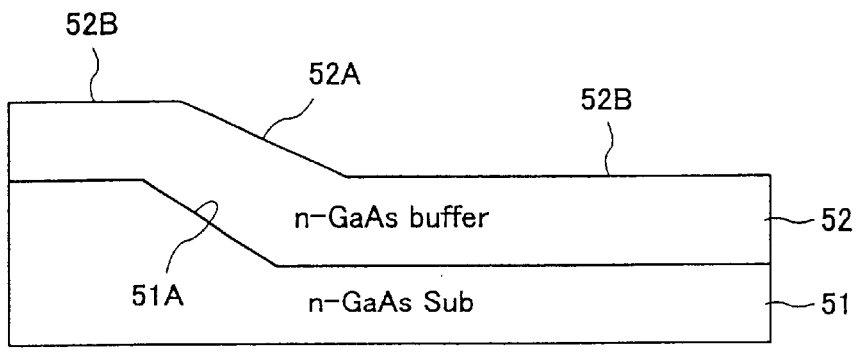

Next, in the step of FIG. 15C, the substrate 51 is introduced to an MOVPE apparatus, and TMG (trimethylgallium) and AsH$_3$ are supplied as gaseous sources with a ratio of 1:100 while holding the substrate 51 at a temperature of 680° C. As a result, there is formed a GaAs buffer layer 52 of n-type on the substrate 51 with a thickness of about 1.5 μm, wherein the GaAs buffer layer 52 is formed to cover the inclined surface region 51A of the substrate 51 with a growth rate of 2 μm/hour. During the growth of the buffer layer 52, a dopant gas of Si$_2$H$_6$ is added to the foregoing gaseous sources, and the buffer layer 52 is formed to have an electron concentration level of about $5\times10^{17}$ cm$^{-3}$. With the growth of the buffer layer, the (411)A surface appears on the surface of the buffer layer even when the sloped surface on the substrate is changed variously between the (411)A surface and the (311)A surface. As this (411)A surface is the surface that appears spontaneously, it becomes possible to remedy any error in the inclination angle of the sloped surface formed on the substrate.

The buffer layer 52 thus formed is grown in conformity with the surface morphology of the substrate 51 that carries the inclined surface region 51A, and thus, the buffer layer 52 has an inclined surface region 52A of a crystal surface near the (411)A surface, which is a facet formed naturally, and a horizontal region 52B extending parallel with the principal surface of the substrate 51.

Figure 15D:
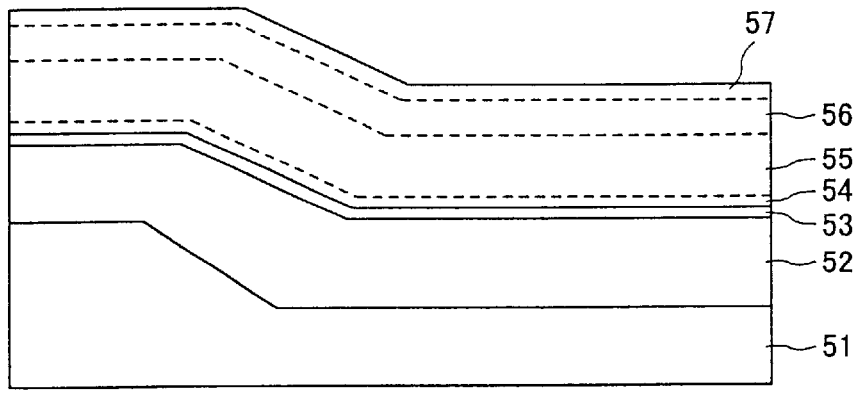

Next, in the step of FIG. 15D, an intermediate layer 53 of n-type GaInP having a composition of $Ga_{0.5}In_{0.5}P$ is formed on the buffer layer 52 at the substrate temperature of 680° C. with a growth rate of 1 μm/hour while supplying TEG (triethylgallium), TMI (trimethylindium) and PH$_3$ as respective source gases, with a ratio of 500 for the flow-rate of the group V gaseous source to 1 for the total flow-rate of the group III gaseous sources (500:1). During the growth of the intermediate layer 53, a dopant gas of Si$_2$H$_6$ is added to the foregoing gaseous sources, and the intermediate layer 53 is formed to have an electron concentration level of about $5\times10^{17}$ cm$^{-3}$. The intermediate layer 53 has a surface morphology corresponding to the surface morphology of the buffer layer 52 and includes an inclined surface region defined by a (411)A surface or a crystal surface near the (411)A crystal surface in correspondence to the inclined surface region 52A of the buffer layer 52.

Next, in the step of FIG. 15D, a first n-type cladding layer 54 of n-type AlGaP having a composition represented as $(Al_{0.7}Ga_{0.3})_{0.5}In_{0.5}P$ is grown on the intermediate layer 53 at the substrate temperature of 710° C. with a growth rate of 2.2 μm/hour to a thickness of 0.1 μm, wherein the growth of the cladding layer 54 is conducted while supplying TMA (trimethylaluminum), TEG, TMI and PH$_3$ as respective gaseous sources, with a ratio of 225 for the flow-rate of the group V gaseous source to 1 for the total flow-rate of the group III gaseous sources (225:1).

During the growth of the cladding layer 54, a dopant gas of Si$_2$H$_6$ is added to the foregoing gaseous sources such that the cladding layer 54 is formed to have an electron concentration level of about $5\times10^{17}$ cm$^{-3}$. The cladding layer 54 thus formed has a surface morphology corresponding to the surface morphology of the intermediate layer 53 and includes an inclined surface region defined by a (411)A surface or a crystal surface near the (411)A surface.

In the step of FIG. 15D, a second n-type cladding layer 55 of n-type AlGaInP having a composition represented as $(Al_{0.7}Ga_{0.3})_{0.5}In_{0.5}P$ is formed on the cladding layer 54 at a substrate temperature of 710° C. with a growth rate of 2.2 μm/hour to a thickness of 1.0 μm, wherein the growth of the cladding layer 55 is conducted by supplying TMA, TEG, TMI and PH$_3$ as the respective gaseous sources, with a ratio of 100 for the flow-rate of the group V gaseous source to 1 for the total flow-rate of the group III gaseous sources (100:1).

The cladding layer 55 thus formed has a surface morphology corresponding to the surface morphology of the underlying cladding layer 54 and includes an inclined surface region defined by a (411)A surface or a crystal surface near the (411)A surface.

Further, in the step of FIG. 15D, a third n-type cladding layer 56 of n-type AlGaInP having a composition represented as $(Al_{0.7}Ga_{0.3})_{0.5}In_{0.5}P$ is formed on the cladding layer 55 with a growth rate of 2.2 μm/hour to a thickness of 0.5 μm at the substrate temperature of 710° C., wherein the growth of the cladding layer 56 is conducted by supplying TMA, TEG, TMI and PH$_3$ as the respective gaseous sources, with a ratio of 225 for the flow-rate of the group V gaseous source to 1 for the total flow-rate of the group III gaseous sources (225:1). During the growth of the cladding layer 56, a dopant gas of $Si_2H_6$ is added to the foregoing gaseous sources such that the cladding layer 56 has an electron concentration level of about $5\times10^{17}$ cm$^{-3}$. The cladding layer 56 thus formed has a surface morphology corresponding to the surface morphology of the cladding layer 55 and includes an inclined surface region defined by a (411)A surface or a crystal surface near the (411)A surface.

Further, in the step of FIG. 15D, a fourth n-type cladding layer 57 of n-type AlGaInP having a composition represented as $(Al_{0.7}Ga_{0.3})_{0.5}In_{0.5}P$ is formed on the cladding layer 56 with a growth rate of 2.2 μm/hour to a thickness of 0.25 μm at the substrate temperature of 710° C., wherein the growth of the cladding layer 57 is conducted by supplying TMA, TEG, TMI and $PH_3$ as the respective gaseous sources, with a ratio of 100 for the flow-rate of the group V gaseous source to 1 for the total flow-rate of the group III gaseous sources (100:1). During the growth of the cladding layer 57, a dopant gas of $Si_2H_6$ is added to the foregoing gaseous sources such that the cladding layer 57 has an electron concentration level of about $5\times10^{17}$ cm$^{-3}$. The cladding layer 57 thus formed has a surface morphology corresponding to the surface morphology of the cladding layer 56 and includes an inclined surface region defined by a (411)A surface or a crystal surface near the (411)A surface.

Figure 15E:
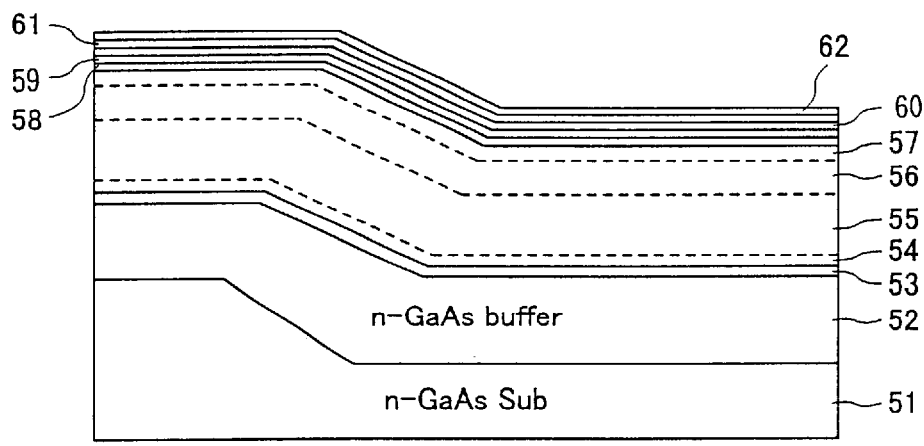

Next, in the step of FIG. 15E, a first AlGaInP optical waveguide layer 58 having a composition of $(Al_{0.5}Ga_{0.5})_{0.5}In_{0.5}P$ is grown on the fourth n-type cladding layer 57 with a growth rate of 1.6 μm/hour to a thickness of 30 nm at the substrate temperature of 710° C., wherein the growth of the optical waveguide layer 58 is conducted by supplying TMA, TEG, TMI and $PH_3$ as the respective gaseous sources, with a ratio of 150 for the flow-rate of the group V gaseous source to 1 for the total flow-rate of the group III gaseous sources (150:1). During the growth of the optical waveguide layer 58, a dopant gas of $Si_2H_6$ is added to the foregoing gaseous sources such that the optical waveguide layer 58 has an electron concentration level of about $5\times10^{17}$ cm$^{-3}$. The optical waveguide layer 58 thus formed has a surface morphology corresponding to the surface morphology of the cladding layer 57 and includes an inclined surface region defined by a (411)A surface or a crystal surface near the (411)A surface.

Further, in the step of FIG. 15E, a second optical waveguide layer 59 of undoped AlGaInP having a composition represented as $(Al_{0.5}Ga_{0.5})_{0.5}In_{0.5}P$ is formed on the first n-type optical waveguide layer 58 of n-type at the substrate temperature of 710° C. while supplying TMA, TEG, TMI and $PH_3$ as respective gaseous sources, wherein the growth of the optical waveguide layer 59 is conducted while supplying the group V gaseous source and the group III gaseous sources with a ratio 300 for flow-rate of the group V gaseous source to 1 for the total flow-rate of the group III gaseous sources (300:1). The optical waveguide layer 59 thus formed has a surface morphology in conformity with the surface morphology of the optical waveguide layer and includes an inclined surface region defined by a (411)A surface or a crystal surface near the (411)A surface.

In the step of FIG. 15E, a barrier layer of undoped AlGaInP and a quantum well layer of undoped GaInP respectively having a composition of $(Al_{0.5}Ga_{0.5})_{0.5}In_{0.5}P$ and $Ga_{0.42}In_{0.58}P$ are formed on the second optical waveguide layer 59 alternately at the substrate temperature of 710° C., while supplying TMA, TEG, TMI and $PH_3$ as respective sources, wherein the step of forming the GaInP quantum well layer is conducted by supplying the group V gaseous source and the group III gaseous sources with a ratio of 500 for the flow-rate of the group V gaseous source to 1 for the total flow-rate of the group III gaseous sources (500:1). Thereby, the quantum well layer is grown with a growth rate of 0.9 μm/hour to a thickness of 5 nm. The InGaP quantum well layer thus formed accumulates therein a strain of 0.7%.

The AlGaInP barrier layer, on the other hand, is formed by supplying the group V gaseous source with a ratio of 300 for the flow-rate of the group V gaseous source to 1 for the total flow-rate of the group III gaseous sources (300:1). Thereby, the barrier layer is grown with a rate of 1.6 μm/hour to a thickness of 4.5 nm.

It should be noted that the formation of the quantum well layer is repeated three times, with intervening steps of forming two barrier layers, and the active layer 60 has an MQW structure including three quantum well layers and two intervening barrier layers. The active layer 60 thus formed has a surface morphology corresponding to the surface morphology of the optical waveguide layer 59 and includes an inclined surface region defined by a (411)A surface or a crystal surface near the (411)A surface.

In the step of FIG. 15E, another undoped AlGaInP optical waveguide layer 61 is formed on the active layer 60 with a composition represented as $(Al_{0.5}Ga_{0.5})_{0.5}In_{0.5}P$ at the substrate temperature of 710° C. while supplying TMA, TEG, TMI and $PH_3$, wherein the gaseous sources are supplied with a ratio of 300 for the flow-rate of the group V gaseous source to 1 for the flow-rate of the group III gaseous source (300:1). The undoped optical waveguide layer 61 is formed with a growth rate of 1.6 μm/hour to a thickness of 10 nm. The optical waveguide layer 61 thus formed has a surface morphology in conformity with the surface morphology of the active layer 60, and includes an inclined surface region defined by a (411)A surface or a crystal surface near the (411)A surface.

Further, in the step of FIG. 15E, a second optical waveguide layer 62 of undoped AlGaInP is formed on the first optical waveguide layer 61 with a composition represented as $(Al_{0.5}Ga_{0.5})_{0.5}In_{0.5}P$, wherein the optical waveguide layer 62 is formed at the substrate temperature of 710° C. with a growth rate of 1.6 μm/hour to a thickness of 40 nm, while supplying TMA, TEG, TMI and $PH_3$ with a ratio of 150 for the flow-rate of the group V gaseous source to 1 for the total flow-rate of the group III gaseous sources (150:1). The optical waveguide layer 62 thus formed has a surface morphology corresponding to the surface morphology of the underlying optical waveguide layer 61 and includes an inclined surface region defined by a (411)A surface or a crystal surface near the (411)A surface.

Figure 15F:
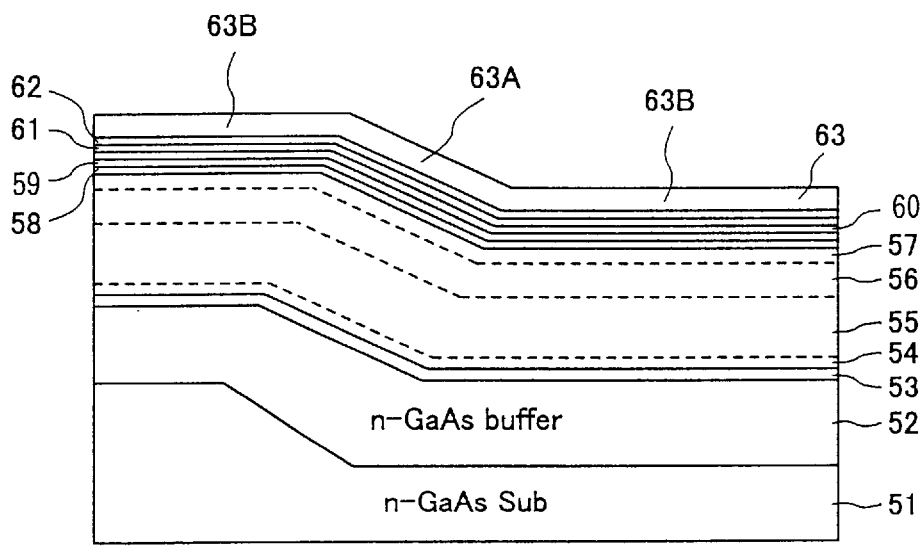

Next, in the step of FIG. 15F, a first p-type cladding layer 63 of AlGaInP is formed on the optical waveguide layer 62 thus formed with a composition represented as $(Al_{0.7}Ga_{0.3})_{0.5}In_{0.5}P$, wherein the cladding layer 63 is formed at the substrate temperature of 710° C. with a growth rate of 2.2 μm/hour to a thickness of 0.45 μm, while supplying TMA, TEG, TMI and $PH_3$ with a ratio of 110 for the flow-rate of the group V gaseous source to 1 for the total flow-rate of the group III gaseous sources (110:1). During the growth of the cladding layer 63, a dopant gas of DEZn is added to the foregoing gaseous sources. The cladding layer 63 thus formed has a surface morphology corresponding to the surface morphology of the underlying optical waveguide layer 62 and includes an inclined surface region 63A defined by a (411)A surface or a crystal surface near the (411)A surface. As a result of the use of DEZn for the dopant, the inclined surface region 63A is doped to a hole concentration level of about $1.5\times10^{18}$ cm$^{-3}$, while horizontal regions 63B formed in the cladding layer 63 at both lateral sides of the inclined surface region 63A and extending parallel to the principal surface of the substrate 51 are doped to a hole concentration level of about $2.2\times10^{17}$ cm$^{-3}$.

It should be noted that, because of the increased hole concentration level in the inclined surface region 63A, there occurs an increase of diffusion coefficient of the p-type dopant in the cladding layer 63 in correspondence to the inclined surface region 63A, and the Zn atoms thus doped into the cladding layer 63 cause a diffusion from the inclined surface region 63A to the adjacent horizontal regions 63B. When the Zn atoms have entered into the horizontal regions 63B, the diffusion coefficient is suddenly decreased due to the decreased concentration level of Zn in the horizontal regions 63B, and there occurs a localized concentration of Zn at the part of the horizontal regions 63B located adjacent inclined surface region 63A, as explained already with reference to FIG. 11.

Figure 15G:
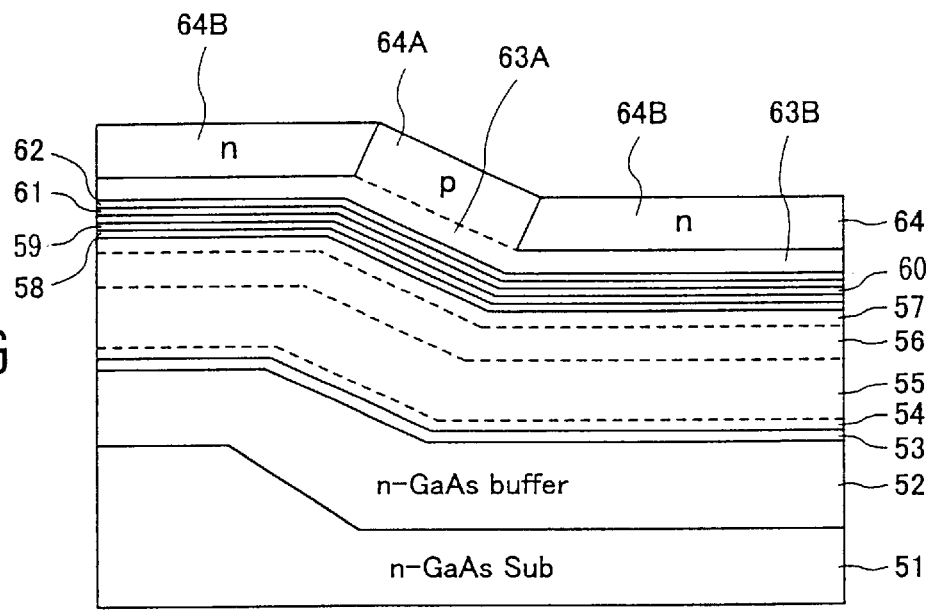

Next, in the step of FIG. 15G, a current blocking layer 64 is formed on the first p-type AlGaInP cladding layer 63 thus formed with a composition of $(Al_{0.7}Ga_{0.3})_{0.5}In_{0.5}P$, wherein the current blocking layer 64 is formed at the substrate temperature of 710° C. with a growth rate of 2.2 μm/hour to a thickness of 0.40 μm, while supplying TMA, TEG, TMI and PH3 with a ratio of 225 for the flow-rate of the group V gaseous source to 1 for the total flow-rate of the group III gaseous sources. During the growth of the current blocking layer 64, a doping gas of DEZn and a doping gas of H$_2$Se are added to the foregoing gaseous sources alternately.

The current blocking layer 64 thus formed has a surface morphology corresponding to the surface morphology of the underlying cladding layer 63 and includes an inclined surface region 64A defined by a (411)A surface or a crystal surface near the (411)A surface, wherein the current blocking layer 64 further includes a pair of horizontal regions 64B extending horizontally at both lateral sides of the inclined surface region 64A. By using the dopant of DEZn and H$_2$Se, a hole concentration level of about $7\times10^{17}$ cm$^{-3}$ and an electron concentration level of about $2\times10^{17}$ cm$^{-2}$ are realized in the inclined surface region 64A, and the inclined surface region 64A is thus doped to the p-type as a whole.

Figure 5:
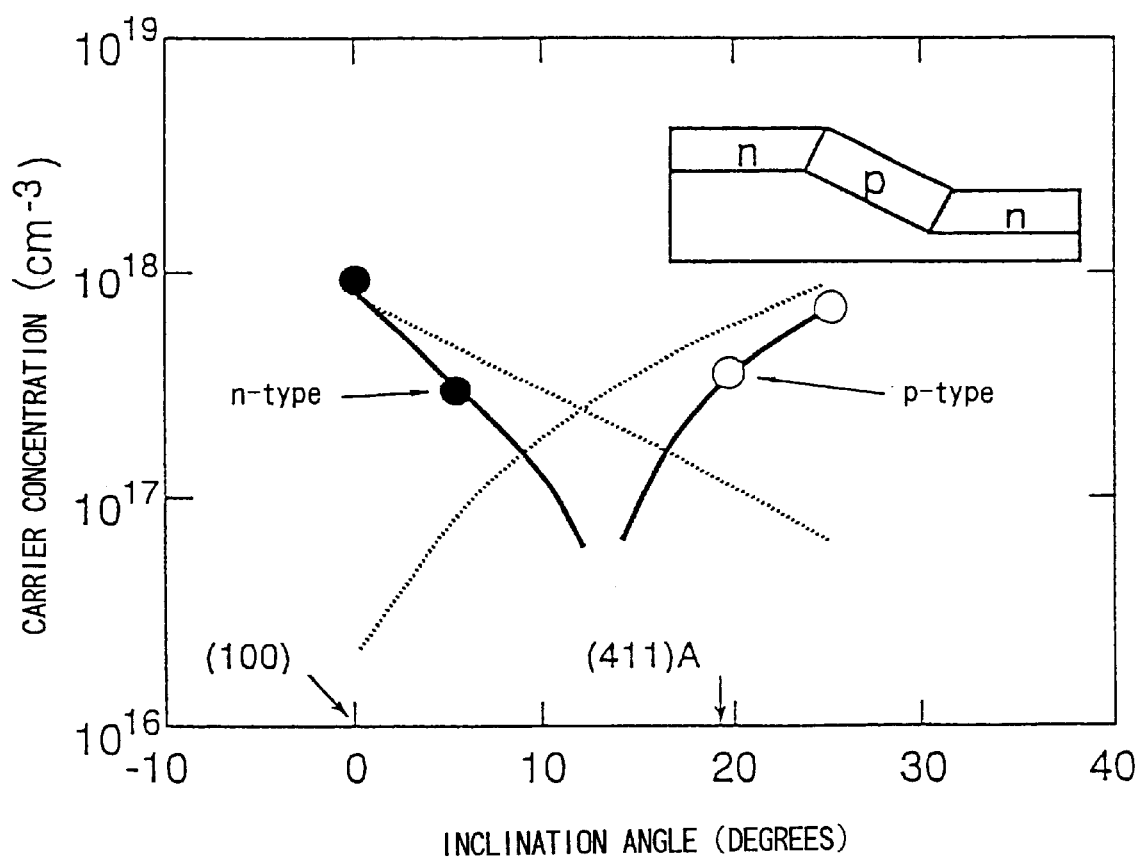
FIG. 5 is a diagram showing the current confinement structure formed inside the cladding layer in the laser diode of FIG. 2.

In contrast, there occurs a hole concentration level of about $2\times10^{17}$ cm$^{-3}$ and an electron concentration level of about $6\times10^{17}$ cm$^{-3}$ in the horizontal regions 64B, and the horizontal regions are doped to n-type as a whole. Reference should be made to FIG. 5 explained before. The foregoing step of alternately supplying DEZn and H$_2$Se may be repeated 20 times, for example, and the AlGaInP current blocking layer may be formed with the foregoing thickness of 0.4 μm when a growth of 20 nm is achieved in each cycle.

Figure 15H:
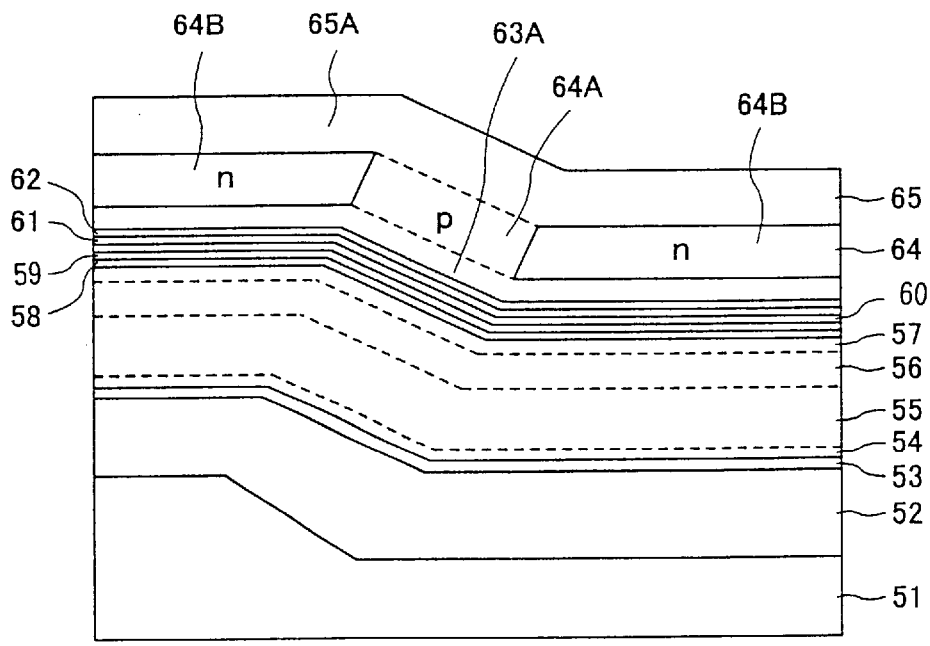

Next, in the step of FIG. 15H, a second p-type cladding layer 65 of AlGaInP is formed on the current blocking layer 64 thus formed with a composition of $(Al_{0.7}Ga_{0.3})_{0.5}In_{0.5}P$, wherein the cladding layer 65 is formed at the substrate temperature of 710° C. with a growth rate of 2.2 μm/hour to a thickness of 0.65 μm while supplying TMA, TEG, TMI and PH3 as respective gaseous sources with a ratio of 225 for the flow-rate of the group V gaseous source to 1 for the total flow-rate of the group III gaseous sources. The cladding layer 65 thus formed has a surface morphology corresponding to the surface morphology of the underlying current blocking layer 64 and includes an inclined surface region 65A corresponding to the inclined surface region 51A of the substrate 51. During the growth of the cladding layer 65, DEZn is added to the foregoing gaseous sources as a dopant gas, and the inclined surface region 65A is doped to the p-type with the carrier concentration level of about $1.5\times10^{18}$ cm$^{-3}$.

Figure 15I:
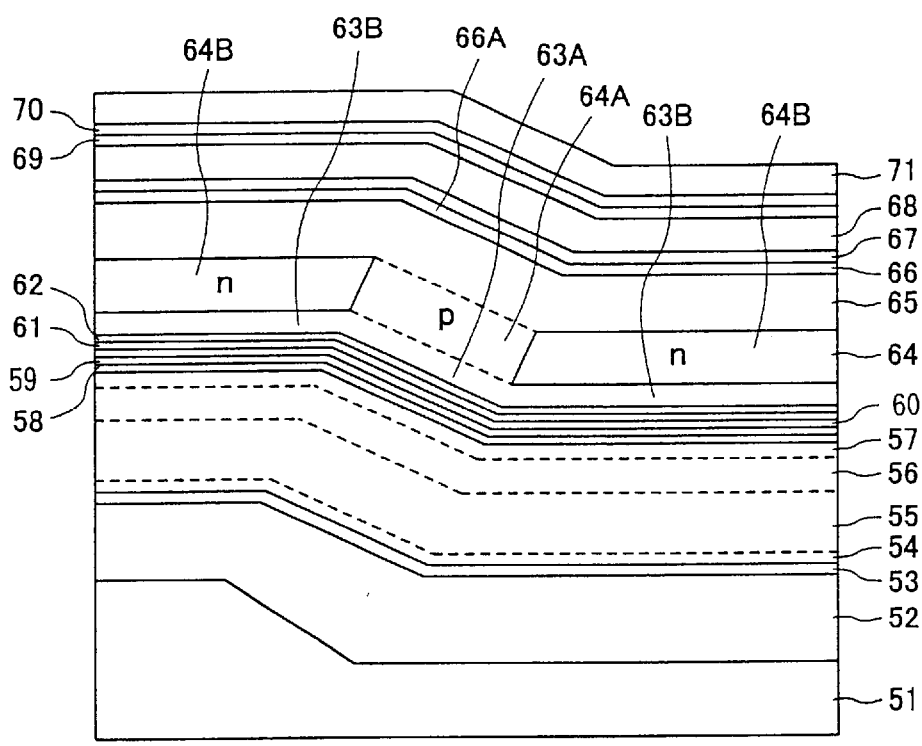

Next, in the step of FIG. 15I, a graded layer 66 of AlGaInP is formed on the cladding layer 65 thus formed such that the composition of the graded layer 66 changes from $(Al_{0.7}Ga_{0.3})O_5In_{0.5}P$ to $(Al_{0.2}Ga_{0.8})_{0.5}In_{0.5}P$, wherein the graded layer 66 is formed at the substrate temperature of 710° C. with a growth rate of 2.2 μm/hour to a thickness of 0.65 μm, while supplying respective gaseous sources of TMA, TEG, TMI and PH$_3$ with a ration of 225 for the flow-rate of the group V gaseous source to 1 for the flow-rate of the group III gaseous sources. The graded layer 66 thus formed has a surface morphology corresponding to the surface morphology of the underlying cladding layer 65 and includes an inclined surface region 66A in correspondence to the inclined surface region 51A of the substrate 51. By adding DEZn to the foregoing gaseous sources during the growth of the graded layer 66, the inclined surface region 66A of the graded layer 66 is doped to the hole concentration level of about $1\times10^{18}$ cm$^{-3}$. In the graded layer 66, the Al content decreases generally linearly in the thickness direction in the part thereof that makes a contact with the cladding layer 65.

Next, the substrate temperature is lowered from 710° C. to 680° C. in the step of FIG. 15I, and a p-type GaInP intermediate layer 67 having a composition represented as $Ga_{0.5}In_{0.5}P$ is formed on the graded layer 66 with a growth rate of 0.1 μm/hour to a thickness of 0.1 μm while supplying TEG, TMI and PH$_3$ as the respective gaseous sources with a ratio of 500 for the flow-rate of the group V gaseous source to 1 for the total flow-rate of the group III gaseous sources (500:1). During the growth of the intermediate layer 67, a p-type dopant of DEZn is added to the foregoing gaseous sources, and the intermediate layer 67 is doped to a carrier concentration level of about $1.0\times10^{18}$ cm$^{-3}$.

Further, a contact layer 68 of p-type GaAs is formed on the intermediate layer 67 in the step of FIG. 15I at a substrate temperature of 680° C. with a growth rate of 2 μm/hour to a thickness of 1 μm while supplying AsH$_3$ and TMG with a ratio of 100 for the flow-rate of AsH$_3$ to 1 for the flow-rate of TMG. The contact layer 68 includes an inclined surface region. By using DEZn for the dopant gas, the inclined surface region of the contact layer 68 is doped to a carrier concentration level of about $1.5\times10^{18}$ cm$^{-3}$.

Next, the substrate temperature is set to 680° C. in the step of FIG. 15I and a first cap layer 69 of p-type GaInP is formed on the contact layer 68 with a composition of $Ga_{0.5}In_{0.5}P$, wherein the first cap layer 69 is formed with a growth rate of 1 μm/hour to a thickness of 0.03 μm while supplying TEG, TMI and PH$_3$ as respective gaseous sources with a ratio of 500 for the flow-rate of the group V gaseous source to 1 for the total flow-rate of the group III gaseous sources. During the growth of the first cap layer 69, a dopant gas of DEZn is added to the foregoing gaseous sources, and the cap layer 69 is doped to a hole concentration level of $1.0\times10^{18}$ cm$^{-3}$.

After the formation of the cap layer 69, the substrate temperature is set to 680° C. in the step of FIG. 15I, and a second cap layer 70 of n-type GaInP is formed on the first cap layer 69 with a composition of $Ga_{0.5}In_{0.5}P$, wherein the second cap layer 71 is formed with a growth rate of 1 μm/hour to a thickness of 0.1 μm while supplying TEG, TMI and PH$_3$ as respective gaseous sources with a ratio of 500 for the flow-rate of the group V gaseous source to 1 for the total flow-rate of the group III gaseous sources (500:1). During the growth of the second cap layer 70, a dopant gas of $Si_2H_6$ is added to the foregoing gaseous sources and the cap layer 70 is doped to an electron concentration level of about $2\times10^{18}$ cm$^{-3}$.

After the formation of the second cap layer 70, the substrate temperature is set to 680° C. in the step of FIG. 15I, and a cover layer 71 of undoped GaAs is formed on the second cap layer 70, wherein the cover layer 71 is formed with a growth rate of 2 μm/hour to a thickness of lam while supplying TMG and $AsH_3$ with a ratio of 100 for the flow-rate of $AsH_3$ to 1 for the flow-rate of TMG.

Figure 15J:
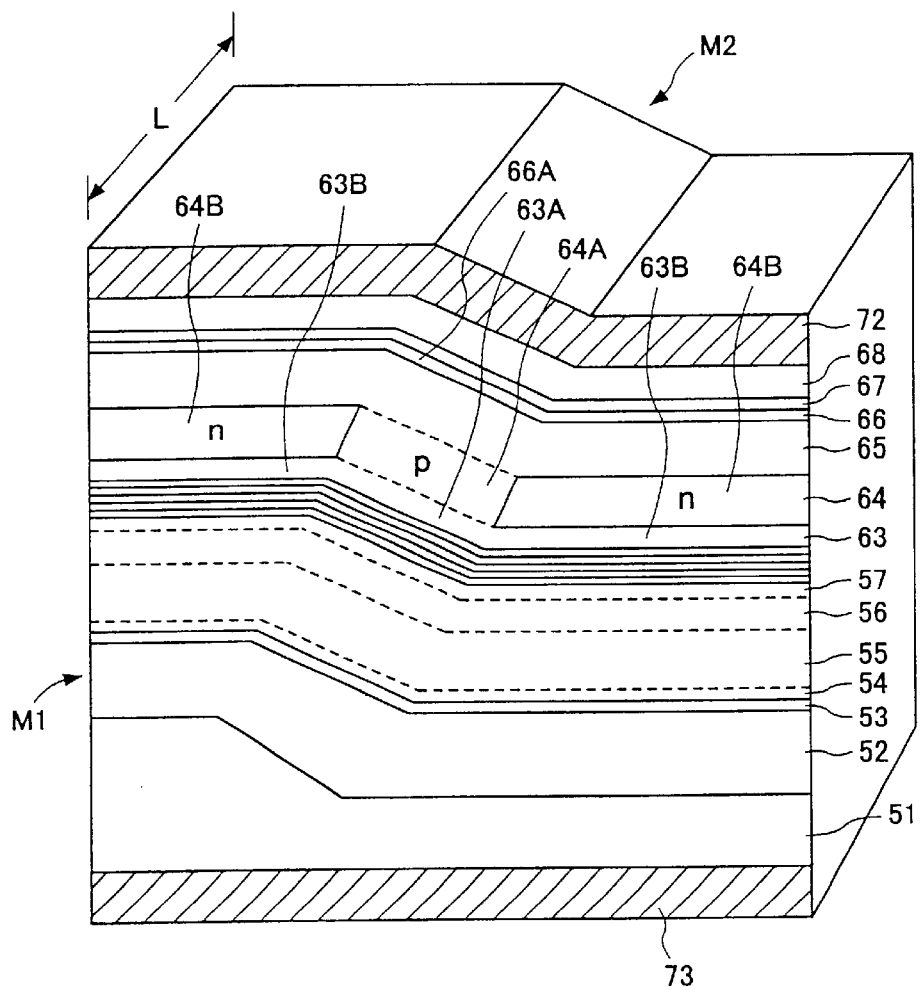

Next, in the step of FIG. 15J, the cover layer 71 and the cap layers 70 and 69 are removed by a wet etching process in the part where an electrode is to be formed, until the contact layer 68 is exposed, and a p-type contact electrode layer 72 of the AuZn/Au structure is formed on the contact layer 68. Further, an n-type contact layer 73 of Au/Ge/Au is formed on the rear surface of the substrate 51.

The structure thus formed is then subjected to a cleaving process, and an anti-reflection film and a reflection film are formed respectively on a first cleaved surface M1 and on a second cleaved surface M2 thus formed as a result of the cleaving process. Thereby, there is formed an optical cavity having a length L.

It should be noted that the process steps of FIGS. 15C–15I can be conducted continuously in the same MOVPE apparatus, without exposing the substrate 51 and the structure formed thereon to the atmosphere.

The laser diode of FIG. 15J thus obtained includes a localized Zn concentration region in the horizontal part 63B of the p-type cladding layer 63 adjacent to the inclined surface region 63A, while the localized Zn concentration region thus formed effectively suppresses the overflowing of the electrons from the active layer 60. Thus, the holes injected from the p-type electrode 72 are caused to flow preferentially to the inclined surface region of the active layer 60, and the threshold current of the laser diode is decreased even when the laser diode is operated at the wavelength of 665 nm or less. Associated therewith, the laser diode of the present embodiment can provide an optical output power of 50–70 mW even when the laser diode is operated in the environmental temperature of 60–70° C.

In the laser diode of FIG. 15J, it should be noted that the active layer 60 is separated from the p-type cladding layer 63 in which the localized Zn concentration regions are formed, by the optical waveguide layers 61 and 62 having a thickness of 10–40 nm. Thus, there occurs no problem of degradation of laser oscillation efficiency caused by the diffusion of Zn from the cladding layer 63 into the active layer 60 even when the laser diode is operated over a long duration.

Further, it should be noted that, because of the fact that the current confinement layer 64 is formed to have the thickness of 0.4 μm, the layer 64 functions as an effective current confinement layer even when the laser diode is operated in a high temperature environment with a large output power.

In the laser diode of FIG. 15J, it should be noted that the n-type cladding layer 57 may be formed to have a stacked structure of an n-type AlGaInP layer having a composition of $(Al_{0.7}Ga_{0.3})_{0.5}In_{0.5}P$ and a thickness of 0.23 μm and another n-type AlGaInP layer having a composition of $(Al_{0.85}Ga_{0.15})_{0.5}In_{0.5}P$ and a thickness of 0.02 μm. Similarly, the p-type cladding layer 63 may be formed to have a stacking structure of a p-type AlGaInP layer having a composition of $(Al_{0.85}Ga_{0.15})_{0.5}In_{0.5}P$ and a thickness of 0.02 μm and another p-type AlGaInP layer having a composition of $(Al_{0.7}Ga_{0.3})_{0.5}In_{0.5}P$ and a thickness of 0.02 μm.

Further, the active layer 60 may have a structure in which four quantum well layers each having a composition of $Ga_{0.42}In_{0.58}P$ and a thickness of 5 nm are stacked with intervening barrier layers having a composition of $(Al_{0.5}Ga_{0.5})_{0.5}In_{0.5}P$.

In the laser diode of the present invention, the quantum well layer constituting the active layer 60 may be formed of GaInAsP or GaInP. Further, the cladding layers may be formed of AlInP or AlGaInP, or AlGaInAsP.

Further, the present invention is not limited to the embodiments described heretofore, but various variations and modifications may be made without departing from the scope of the invention.

What is claimed is:

1. A laser diode, comprising:
   a substrate including an inclined surface region on a principal surface thereof;
   an active layer formed over said substrate and including an inclined surface region corresponding to said inclined surface region of said substrate;
   a first cladding layer of p-type formed on said active layer and including an inclined surface region corresponding to said inclined surface region of said active layer;
   a second cladding layer formed on said first cladding layer and including an inclined surface region of p-type corresponding to said inclined surface region of said first cladding layer, said second cladding layer further including a horizontal region of n-type adjacent to said inclined surface region of p-type, said horizontal region extending parallel to said principal surface of said substrate;
   a first electrode connected electrically to said substrate; and
   a second electrode connected electrically to said inclined surface region of said second cladding layer,
   said inclined surface region of said first cladding layer having a carrier concentration level of $1\times10^{18}$ cm$^{-3}$ or more,
   said first cladding layer having a thickness of 0.35 μm or more.

2. A laser diode as claimed in claim 1, wherein said horizontal region of said second cladding layer has an electron concentration level of $6\times10^{17}$ cm$^{-3}$ or more.

3. A laser diode as claimed in claim 1, wherein said active layer provides a laser oscillation at a wavelength of 665 nm or less when operated in a room temperature environment.

4. A laser diode as claimed in claim 1, wherein said active layer includes a quantum well layer formed of a material selected from any of GaInAsP and GaInP, and wherein said first and second cladding layers are formed of a material selected from AlInP, AlGaInP and AlGaInAsP.

5. A laser diode as claimed in claim 1, wherein said inclined surface region of said cladding layer is formed of a (411)A surface.

6. A laser diode, comprising:
   a substrate including an inclined surface region on a principal surface thereof;
   an active layer formed over said substrate, said active layer including an inclined surface region corresponding to said inclined surface region of said substrate;
   a first cladding layer of p-type formed on said active layer, said first cladding layer including an inclined surface region corresponding to said inclined surface region of said active layer,
   a second cladding layer formed on said first cladding layer, said second cladding layer including an inclined surface region of p-type corresponding to said inclined surface region of said first cladding layer, said second cladding layer further including a horizontal region of n-type adjacent to said inclined surface region of p-type, said horizontal region being parallel to said principal surface of said substrate;

a first electrode connected electrically to said substrate; and a second electrode connected electrically to said inclined surface region of said second cladding layer, said inclined surface region of said first cladding layer having a carrier concentration level of $1\times10^{18}$ cm$^{-3}$ or more, said first cladding layer comprising an AlGaInP film containing Al with a ratio to Ga of 0.7:0.3 or more.

7. A laser diode as claimed in claim 6, wherein said horizontal region of said second cladding layer has an electron concentration level of $6\times10^{17}$ cm$^{-3}$ or more.

8. A laser diode as claimed in claim 6, wherein said active layer provides a laser oscillation at a wavelength of 665 nm or less when operated in a room temperature environment.

9. A laser diode as claimed in claim 6, wherein said active layer includes a quantum well layer formed of a material selected from any of GaInAsP and GaInP, and wherein said first and second cladding layers are formed of a material selected from AlInP, AlGaInP and AlGaInAsP.

10. A laser diode as claimed in claim 6, wherein said inclined surface region of said cladding layer is formed of a (411)A surface.

11. A laser diode, comprising:

a substrate including an inclined surface region in a principal surface thereof;

an active layer formed over said substrate, said active layer including an inclined surface region corresponding to said inclined surface region of said substrate;

a first cladding layer of p-type formed on said active layer, said active layer including an inclined surface region corresponding to said inclined surface region of said active layer;

a second cladding layer formed on said first cladding layer, said second cladding layer including a p-type inclined surface region corresponding to said inclined surface region of said first cladding layer, said second cladding layer including a horizontal region of n-type adjacent to said p-type inclined surface region, said horizontal region extending parallel to said principal surface of said substrate, a first electrode connected electrically to said substrate; and a second electrode connected electrically to said inclined surface region of said second cladding layer, said inclined surface region of said first cladding layer having a carrier concentration level of $1\times10^{18}$ cm$^{-3}$ or more, at least a part of said first cladding layer having a bandgap larger than a bandgap of an AlGaInP film having a composition of $(Al_{0.7}Ga_{0.3})_{0.5}In_{0.5}P$.

12. A laser diode as claimed in claim 11, wherein said horizontal region of said second cladding layer has an electron concentration level of $6\times10^{17}$ cm$^{-3}$ or more.

13. A laser diode as claimed in claim 11, wherein said active layer provides a laser oscillation at a wavelength of 665 nm or less when operated in a room temperature environment.

14. A laser diode as claimed in claim 11, wherein said active layer includes a quantum well layer formed of a material selected from any of GaInAsP and GaInP, and wherein said first and second cladding layers are formed of a material selected from AlInP, AlGaInP and AlGaInAsP.

15. A laser diode as claimed in claim 11, wherein said inclined surface region of said cladding layer is formed of a (411)A surface.

16. A laser diode, comprising:

a substrate having an inclined surface region on a principal surface thereof;

an active layer formed over said substrate, said active layer including an inclined surface region corresponding to said inclined surface region of said substrate;

a first cladding layer formed on said active layer, said first cladding layer including an inclined surface region corresponding to said inclined surface region of said active layer;

a second cladding layer formed on said first cladding layer, said second cladding layer including an inclined surface region of p-type corresponding to said inclined surface region of said first cladding layer and a pair of n-type regions adjacent to said p-type inclined surface region at both lateral sides thereof, said n-type regions extending parallel with said principal surface of said substrate;

a first electrode connected electrically to said substrate; and a second electrode connected electrically to said inclined surface region of aid second cladding layer, said inclined surface region of said first cladding layer having a carrier concentration level of $1\times10^{18}$ cm$^{-3}$ or more, said second cladding layer having a thickness of 0.35 µm or more.

17. A laser diode as claimed in claim 16, wherein said inclined surface region of said second cladding layer has an electron concentration level of $6\times10^{17}$ cm$^{-3}$ or more.

18. A laser diode as claimed in claim 16, wherein said active layer provides a laser oscillation at a wavelength of 665 nm or less when operated in a room temperature environment.

19. A laser diode as claimed in claim 16, wherein said active layer includes a quantum well layer formed of a material selected from any of GaInAsP and GaInP, and wherein said first and second cladding layers are formed of a material selected from AlInP, AlGaInP and AlGaInAsP.

20. A laser diode as claimed in claim 16, wherein said inclined surface region of said cladding layer is formed of a (411)A surface.

* * * * *